(12) United States Patent  
Inamdar et al.

(10) Patent No.: US 9,312,878 B1  
(45) Date of Patent: Apr. 12, 2016

(54) SUPERCONDUCTOR ANALOG TO DIGITAL CONVERTER

(71) Applicant: Hypres, Inc., Elmsford, NY (US)

(72) Inventors: Amol Inamdar, Elmsford, NY (US); Deepnarayan Gupta, Briarcliff Manor, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 14/522,842

(22) Filed: Oct. 24, 2014

Related U.S. Application Data

(63) Continuation of application No. 13/482,266, filed on May 29, 2012, now Pat. No. 8,872,690, which is a continuation of application No. 12/542,585, filed on Aug. 17, 2009, now Pat. No. 8,188,901.

(60) Provisional application No. 61/089,489, filed on Aug. 15, 2008.

(51) Int. Cl.
| | |
|---|---|
| *H03M 1/12* | (2006.01) |
| *H03M 3/02* | (2006.01) |
| *H03M 1/68* | (2006.01) |
| *H03M 1/08* | (2006.01) |

(52) U.S. Cl.
CPC .............. *H03M 3/02* (2013.01); *H03M 1/0854* (2013.01); *H03M 1/12* (2013.01); *H03M 1/68* (2013.01)

(58) Field of Classification Search
CPC ....................................................... H03M 1/12
USPC ............................ 341/156, 133, 155, 137, 144
See application file for complete search history.

(56) References Cited

U.S. PATENT DOCUMENTS

| | | | | |
|---|---|---|---|---|
| 5,990,815 A | * | 11/1999 | Linder ................ | H03M 1/0641 341/131 |
| 6,583,747 B1 | * | 6/2003 | van der Goes ... | H03K 17/04106 341/156 |
| 6,999,019 B2 | * | 2/2006 | Cosand ................ | H03M 1/145 341/122 |
| 7,570,185 B2 | * | 8/2009 | Rao ..................... | H03M 1/1028 341/118 |
| 2010/0292993 A1 | * | 11/2010 | Vaillancourt ......... | G10L 19/032 704/500 |

* cited by examiner

*Primary Examiner* — Peguy Jean Pierre  
(74) *Attorney, Agent, or Firm* — Steven M. Hoffberg, Esq.; Ostrolenk Faber LLP

(57) ABSTRACT

Superconductor analog-to-digital converters (ADC) offer high sensitivity and large dynamic range. One approach to increasing the dynamic range further is with a subranging architecture, whereby the output of a coarse ADC is converted back to analog and subtracted from the input signal, and the residue signal fed to a fine ADC for generation of additional significant bits. This also requires a high-gain broadband linear amplifier, which is not generally available within superconductor technology. In a preferred embodiment, a distributed digital fluxon amplifier is presented, which also integrates the functions of integration, filtering, and flux subtraction. A subranging ADC design provides two ADCs connected with the fluxon amplifier and subtractor circuitry that would provide a dynamic range extension by about 30-35 dB.

20 Claims, 36 Drawing Sheets

SUPERCONDUCTOR ANALOG TO DIGITAL CONVERTER

REFERENCE TO RELATED APPLICATIONS

The present application is a Continuation of U.S. patent application Ser. No. 13/482,226, filed May 29, 2012, now U.S. Pat. No. 8,872,690, issued Oct. 28, 2014, which is a Continuation of U.S. patent application Ser. No. 12/542,585, filed Aug. 17, 2009, now U.S. Pat. No. 8,188,901, issued May 29, 2012, which claims benefit of priority from U.S. Provisional Patent Application No. 61/089,489, filed Aug. 15, 2008, the entirety of which is expressly incorporated herein by reference.

STATEMENT OF GOVERNMENT RIGHTS

This invention was made with government support under contract # N00014-06-1-0041 awarded by The U.S. Navy. The government has certain rights in the invention.

FIELD OF THE INVENTION

The present invention relates to the field of radio frequency analog-to-digital converters and methods, and more particularly to analog-to-digital converters with very large dynamic range.

BACKGROUND OF THE INVENTION

The inexorable pursuit of higher performance analog-to-digital converters (ADCs) is fundamental to progress in direct digital radio-frequency receivers and related instrumentation. Cryogenic superconducting ADCs enable ultrafast switching speed, low power, natural quantization of magnetic flux, quantum accuracy, and low noise, which in turn enable fast and accurate data conversion between the analog and digital domains. Based on rapid single-flux quantum (RSFQ) logic, these integrated circuits are capable of achieving performance levels unattainable by any other technology, as reviewed in O. A. Mukhanov, D. Gupta, A. M. Kadin, and V. K. Semenov, "Superconductor Analog-to-Digital Converters," *Proceedings of the IEEE*, vol. 92, pp. 1564-1584, 2004, expressly incorporated herein by reference.

Over the last decade, substantial progress has been made toward building complete cryocooled digital receiver prototypes that use superconductor ADCs. The simplest superconductor ADCs have already demonstrated performance that compare favorably with the best semiconductor ADCs, which employ complex multi-modulator architectures and massive digital post-processing for error correction.

One of the most critical parameters to characterize the performance of an ADC is its dynamic range. Dynamic range of the ADC is bounded by the maximum signal that can be digitized and the quantization noise or device noise floor, whichever is greater. The dynamic range is typically given as a power ratio of the maximum signal to the minimum detectable signal, in dB, and expressed as a maximum signal to noise ratio (SNR). Equivalently, it may be given as the effective number of bits (ENOB) by the standard formula ENOB= (SNR[dB]-1.76)/6.02. A related quantity is the spurious-free dynamic range (SFDR), which is given by the ratio between the full-scale power and the largest nonlinear artifact generated by the data conversion that is present in the output band of the ADC. For high-performance ADCs, it is important to minimize nonlinearities as well as noise. Digital-to-analog converters (DACs) have similar considerations.

Superconductor data converters are based on ideal quantization of magnetic flux in units of the flux quantum $\Phi_0 = h/2e = 2.07$ mV-ps, where h=Planck's constant and e is the charge on the electron. RSFQ circuits transport these single-flux-quanta (SFQ) in voltage pulses of height ~1 mV and pulsewidth ~2 ps, such that the area under each pulse is exactly $\Phi_0$. In this way, both ADCs and DACs in this technology are practically ideal and linear. Furthermore, SNR and SFDR of broadband superconductor ADCs are among the best in any technology. Still, it is greatly desirable to increase the SNR and SFDR of a superconductor ADC.

One class of ADCs with an extended dynamic range is a subranging ADC, which combines a coarse ADC, a DAC, and a fine ADC used together in a generic architecture as shown in FIG. 1. In a subranging ADC with two ranges, the signal to be digitized is split between a coarse ADC and a fine ADC. See, U.S. Pat. Nos. 7,365,663, 7,362,125, 7,313,199, 7,280,623, 7,038,604, 6,922,066, 6,771,201, 6,750,794, 6,653,962, 6,608,581, 6,509,853, 6,331,805, 6,225,936, 6,127,960, 5,936,458, 5,731,775, 5,305,006, and 5,272,479, expressly incorporated herein by reference.

In the most ideal case, one may be able to double the number of effective bits digitized, sharply increasing the dynamic range. The basic approach, as known in the prior art, involves splitting the incoming analog signal into two parts using an appropriate signal distribution network, one part of which goes to the coarse ADC, which generates a set of digital bits. This digital output is also converted back to an analog signal in a digital to analog converter (DAC), and is combined with the second part of the analog input in a subtractor unit, such that most of the signal should cancel out, leaving only a small residue signal. Accurate cancellation requires that the DAC be substantially accurate and linear, and that an appropriate time delay and linear gain amplifier (or attenuator) be included to ensure that the direct analog signal and the regenerated analog signal are substantially matched. The residue signal can then be amplified in a linear amplifier and fed to the fine ADC, which generates another set of digital bits. The most significant bits (MSBs) are combined with the least significant bits (LSBs) in a digital adder (with appropriate digital delay and digital scaler or multiplier) to generate the combined digital output.

It is important to note that if the DAC is precisely linear and if the gain and delay of the regenerated analog signal are adjusted properly, this subranging ADC can completely compensate for quantization noise and nonlinearity in the coarse ADC. In this case, the performance is limited only by the fine ADC. In the ideal case, with a sharply reduced residue signal, the gain in the amplifier will be large so as to make use of the full input range of the fine ADC, thus gaining additional bits of precision. If one assumes that the full-scale input ranges of the fine ADC and the coarse ADC are the same, and if, for example, the residue signal is a factor of 100 smaller in amplitude than the initial analog signal, then the gain of amplifier could be as high as 100. This, in turn, could lead to an increase in dynamic range for the subranging ADC of as much as this factor of 100, although this would likely be reduced by various non-idealities. In some cases of the prior art, the fine ADC and the coarse ADC may have different input ranges. For example, the fine ADC may be intrinsically more sensitive (reduced full-scale input level and noise level) than the coarse ADC, in which case the required gain of amplifier would be reduced accordingly.

Subranging ADCs have been developed using semiconductor technology of the prior art, including a semiconductor DAC and transistor amplifiers. However, it is well known that semiconductor DACs may exhibit significant nonlinearity, thus limiting the performance of the overall subranging ADC. As a way of avoiding this problem, Hansen and Saxe proposed in U.S. Pat. No. 6,489,913, "Subranging ADC using a sigma-delta converter," expressly incorporated herein by reference, an alternative design for a subranging ADC as shown in FIG. 2 (taken from this patent). FIG. 2 employs a sigma-delta modulator 12 for the coarse ADC, which generates an oversampled sequence of single-bit output pulses, the low-frequency spectrum of which corresponds to the input analog signal. This oversampled pulse train is filtered in a digital decimation filter 26 to generate a multibit Nyquist-rate digital representation. The function of the DAC is obtained simply by analog filtering the single-bit pulse train with a low-pass filter 18 to remove the high-frequency quantization noise. Since a passive analog filter is typically quite linear, this DAC is also equally linear, enabling improved performance in the subranging ADC. In a further aspect of the design of FIG. 2, the functions from FIG. 1 of the subtractor and the amplifier are combined in a high-gain differential amplifier 22. To the degree that the input analog signal and the coarse regenerated analog signal cancel out, a high linear gain K in this amplifier permits additional bits of precision to be generated by the fine ADC 24.

It is of interest to employ high-performance superconductor ADCs in a similar way to that in Hansen et al., to achieve a subranging ADC with further increased dynamic range. Oversampled superconductor modulators and digital decimation filters are well known in the prior art. Indeed, Gupta proposed in U.S. Pat. No. 6,489,913, "Subranging Technique Using Superconductor Technology", expressly incorporated herein by reference, how a coarse superconductor ADC and a fine superconductor ADC could be combined to create a subranging superconductor ADC with increased dynamic range. This is shown in FIG. 3, taken from FIG. 18 of Gupta, where a coarse superconductor ADC based on a Superconducting Quantum Interference Device (SQUID) is combined with a similar fine superconductor ADC, and a superconductor DAC, to generate additional bits of precision.

However, superconductor technology does have a serious shortcoming in the absence of a high-gain linear transistor amplifier. While some semiconductor amplifiers can operate at cryogenic temperatures, the impedance and threshold sensitivity are poorly matched to superconductor circuits, making inclusion of a semiconductor amplifier within a superconductor circuit generally impractical. Therefore, high-gain linear amplifiers are difficult to implement in superconductor technology. Furthermore, although transformers are linear and can be used to achieve current gain or voltage gain, as passive devices they are unable to achieve power gain. It is difficult to construct a superconducting subranging ADC without a suitable high-gain amplifier.

SUMMARY OF THE INVENTION

The present invention achieves an improvement by at least providing high-gain linear differential amplification in superconducting technology, and/or an alternative architecture that substantially reduces the required gain factor. Other aspects of the invention will also be apparent either separately or in combination with the disclosed amplification technologies and/or circuit architecture. Likewise, the various embodiments may be used in circuit topologies which may be different than subranging ADCs without departing from the spirit or scope of this disclosure.

One aspect of the present disclosure presents a practical subranging ADC architecture using a set of known and novel components that are well matched to superconducting device technology. A preferred embodiment of the present invention is shown schematically in FIG. 4A.

As described above, superconducting ADCs are based on flux quantization in units of $\Phi_0$. Magnetic flux is coupled into a superconducting loop with at least one Josephson junction (essentially equivalent to a SQUID), and the Josephson junction releases the flux in a sequence of SFQ voltage pulses. If these voltage pulses are counted (digital integration), the magnitude of the input flux can be directly measured. This is functionally equivalent to a first-order delta ADC, with implicit feedback since each pulse automatically reduces the flux in the loop by $\Phi_0$. A delta ADC is an oversampling-type ADC which is known in the prior art, but is distinct from the better known sigma-delta ADC. A delta ADC essentially generates the derivative of the incoming analog signal, and requires the use of a digital integrator following the ADC. Alternatively, a delta ADC may be converted to a sigma-delta ADC by the addition of an analog integrator in front of the delta ADC. Both delta and sigma-delta ADCs in superconductor technology are known, but the delta design may be preferred in some cases.

Such a simple delta ADC is compatible only with a unipolar input signal, since the SFQ pulses are all positive. However, a radio frequency signal is bipolar, and the delta ADC may be modified by the addition of a carrier signal that permits a bipolar input. This is known as a Phase Modulation Demodulation ADC (PMD). Of course, this carrier must be subtracted off in subsequent processing.

For a delta ADC based on the PMD architecture, in the absence of an analog signal, the single junction SQUID quantizer pulses at the carrier frequency ($f_{car}$), which is determined by the average fluxon transport rate through the modulator. When an additional analog input signal is coupled to the quantizer loop, the timing of each output pulse gets advanced or retarded in proportion to the derivative of the analog input. This process encodes the signal derivative into SFQ pulse positions, which need to be decoded by measuring the pulse positions against a time reference. Hence the phase modulated SFQ pulse stream is passed to a phase demodulator (synchronizer), which is a clocked sampling circuit that generates a '1' or a '0' indicating whether or not an SFQ pulse arrived during that clock interval. Thus, the synchronizer decodes the pulse position information into numbers (single-bit in the simplest implementation, though devices with a higher number of bits may be implemented). The oversampled digital data and the corresponding clock from the synchronizer then proceed directly to the decimation filter, where it is first integrated at full speed, and then averaged further, reducing the output bandwidth and increasing the effective number of bits.

The use of two PMD ADCs in a subranging architecture is illustrated in FIG. 4C. A received signal is coupled to a coarse ADC and to a flux subtractor. The coarse ADC produces an output that represents the received signal, with quantization noise resulting from limited quantization step size. This oversampled bit sequence needs to be integrated to reconstruct a multibit digital equivalent of the input signal. This integrated output may be averaged further and read out at the decimated rate to reduce the output bandwidth and increase the effective number of bits. These bits form the most significant bits (MSB) of the subranging ADC. In order to extract the least significant bits (LSB), the oversampled 1-bit coarse ADC output is integrated in an analog integrator (based on a superconducting inductor), and then low-pass filtered to be converted back to the analog domain. Thus, this circuit is effectively a DAC with nearly ideal linearity. This analog signal is then subtracted from the input signal in a "flux subtractor", a transformer which couples, and effectively subtracts, magnetic fields corresponding to properly synchronized and gain-adjusted representations of the input signal and analog signal from the coarse ADC, to generate a residue signal representing the error of the coarse ADC. The error signal is then digitized by the fine ADC to get the LSBs. The residue signal, being of lower amplitude than the original signal, is ideally at the full-scale range of the fine ADC, which may be another PMD ADC which is similar to the coarse ADC. The digital output of the fine ADC is combined (e.g., summed) with that of the coarse ADC to yield a digital output with a larger dynamic range (a greater effective number of bits). The output significance of the fine ADC may overlap with the lower bits of the multibit representation of the coarse ADC, permitting compensation for various errors.

The design of FIG. 4C avoids the need for an amplifier at the output of the flux subtractor. Rather than amplifying the difference, as proposed in the embodiments according to FIGS. 1 and 2, instead this design couples a small fraction of the input signal to the coarse ADC, and amplifies the output of the coarse ADC by a factor K to restore the signal component to the same value as the remaining fraction of the input signal. Given the fact that the combination of the coarse ADC and DAC in superconductor technology conserves magnetic flux, these two scalings should permit accurate cancellation of the coarse signal in the flux subtractor. If one assumes that the fine ADC and the coarse ADC have the same sensitivity, the factor K corresponds to the additional dynamic range that the subranging ADC can ideally achieve. For example, if K=64, this corresponds to up to an additional 6 bits of precision. Alternatively, if the fine ADC is intrinsically more sensitive than the coarse ADC, additional precision may be obtained with a reduced factor of K.

A microwave splitter would be used to direct a small fraction of the power to the coarse ADC, with the rest going toward the subtractor. An analog linear amplifier is difficult to achieve within superconductor technology, as indicated in the Background section. In a preferred embodiment, this amplifier may be implemented in the digital domain, using active superconducting elements (based on Josephson junctions) to reproduce SFQ pulses either in parallel or sequentially. Circuits to achieve this are described in the detailed specification below. However, by providing an increased energy represented by the digital pulses as compared to the basic digital stream of "bits", that is, the quantized pulses, a power amplification is achievable from the DAC, which also acts as a low pass filter.

The inter-range circuitry that integrates the coarse and the fine ADC performs multiple signal processing functions in the digital and in the analog domains. One embodiment of this inter-range mixed-signal processor incorporates the functions of linear amplification, integration, carrier subtraction, signal subtraction, and filtering together in a single integrated device. In another preferred embodiment of the invention, the fine ADC may have a different optimized design than the coarse ADC. For example, the fine ADC may be substantially more sensitive than the coarse ADC, which would enable increased dynamic range with a significantly reduced value of K. Alternatively, the fine ADC may comprise a sigma-delta ADC, which is less sensitive to high frequency noise, and hence relaxes the requirements placed on the filter in the inter-range mixed-signal processor (see FIG. 5). Functional simulations of several subranging ADC configurations are presented, and show improvement of up to 35 dB in SNR over a single-stage superconducting ADC. A similar improvement of spur-free dynamic range (SFDR) is also expected since the harmonics and inter-modulation distortion produced by the coarse ADC appear in the residue and are treated the same way as the quantization error. These distortions will be substantially cancelled in the final output combining the coarse and the fine ADC outputs.

A preferred embodiment focuses on the case whereby the coarse ADC generates a single oversampled train of SFQ pulses. However, this approach is not limited to a single pulse train, but rather can be easily extended to two or more pulse trains having either equal or unequal weights. Therefore, this approach is compatible with a coarse ADC with a multi-bit output.

As may be evident to one ordinarily skilled in the art, other embodiments based on a variety of ADCs, DACs, filters, integrators, digital amplifiers, and subtractors are also compatible with the basic subranging architecture described herein.

It is therefore an object to provide an analog-to-digital converter and method of conversion, comprising: an input adapted to receive a first analog signal; a coarse analog-to-digital converter, adapted to convert a first representation of the first analog signal to a first logical representation of the first analog signal having an associated first quantized energy per bit; a digital amplifier adapted to produce a second logical representation based on at least the first logical representation, having an associated second quantized energy per bit, the second quantized energy per bit being higher by at least 6 dB than the first quantized energy per bit, and transform the energy represented by the second logical representation into a second analog signal; a subtractor adapted to combine a time synchronized second representation of the first analog signal and the second analog signal to generate an analog residue signal representing a difference of the first analog signal and the second analog signal, the first and second representations of the first analog signal being respectively scaled based on at least a relationship between the first quantized energy per bit and the second quantized energy per bit; a fine analog-to-digital converter that is adapted to convert the analog residue signal to a third logical representation; and a digital processor, adapted to combine the first logical representation and the third logical representation to generate a fourth logical representation which represents the first analog signal with greater precision than the first logical representation.

Another object provides a method, and corresponding system, for converting an analog signal to a corresponding digital representation, comprising: receiving a first analog signal; converting a first representation of the first analog signal to a first logical representation of the first analog signal having an associated first quantized energy per bit; producing a second logical representation based on at least the first logical representation, having an associated second quantized energy per bit, the second quantized energy per bit being higher by at least 6 dB than the first quantized energy per bit; transforming the second logical representation into a second analog signal; subtracting a time-synchronized representation of the second analog signal and a second representation of the first analog signal to generate an analog residue signal, the second representation of the first analog signal being dependent on at least a relationship between the first quantized energy per bit and the second quantized energy per bit; converting the analog residue signal to a third logical representation; and digitally combining the first logical representation and the third logical representation to generate a fourth logical representation which represents the first analog signal with greater precision than the first logical representation.

At least one of the coarse analog-to-digital converter and the fine analog-to-digital converter may quantize the input in units of magnetic flux. The coarse and/or the fine analog-todigital converter may comprise a delta modulator (which may be a phase-modulation-demodulation modulator), and/or a sigma-delta modulator. The coarse analog-to-digital converter is preferably a delta converter employing phase-modulation-demodulation, and the fine analog-to-digital converter is preferably a sigma-delta or delta modulator.

The subtractor may comprise a transformer, and preferably a superconducting transformer. The transformer may have multiple loops, and may be used to couple energy from a distributed array of driving elements.

The second logical representation may be transformed into the second analog signal with a digital-to-analog converter which comprises at least one of an integrator and a low-pass filter.

The first logical representation may comprise a series of pulses, and wherein the digital amplifier converts each pulse of the first representation into a plurality of pulses of the second logical representation in parallel.

The first logical representation may comprise a series of pulses each having an associated magnetic flux, and wherein the digital amplifier converts each pulse of the first logical representation to a pulse of the second logical representation having an increased total magnetic flux with respect to the associated magnetic flux of a pulse of the first logical representation. The digital amplifier may comprise at least one Josephson junction, and may employ various superconducting technologies.

The digital amplifier is integrated with the subtractor, as well as other possible functions and elements. The integrated digital amplifier-subtractor may comprise a distributed array comprising a plurality of identical components.

The digital amplifier may receive a fifth logical representation, and perform a logical operation on at least the first logical representation and the fifth logical representation. The fifth logical representation may thus comprise a phase-modulation carrier, and wherein the logical operation comprises a sum or a difference. Thus, the digital amplifier may, for example, perform a digital subtraction of a carrier wave, or perform other logical data manipulation.

The second logical representation may comprise a single-bit train of digital pulses, or at least two parallel trains of digital pulses. The at least two parallel trains of digital pulses represent signal components of equal logical weight. The at least two parallel trains of digital pulses may represent signal components of unequal logical weight. Generally, each digital pulse on a given line has the same logical significance as a digital pulse at a different time; however, digital pulses at various times may also have different significance, which may be encoded based on a digital pulse power (duration, height, etc.) or an interpretation of the pulse by a receiving device.

At least one of the fine and coarse analog-to-digital converters may comprise a digital filter. The digital filter may comprise a digital integrator. The digital filter may comprise a decimator that reduces the output sampling rate.

The system may also comprise a digitally adjustable time delay, adapted to synchronize the first and second representations of the first analog signal.

The coarse analog-to-digital converter may have at least two quantization thresholds.

A further object provides a method of subranging analog-to-digital conversion, and corresponding apparatus, wherein:

(a) a first representation of a first analog signal is converted to a first oversampled train of digital pulses in a coarse analog-to-digital converter having a first digital pulse energy;

(b) the power in the first oversampled train of digital pulses is amplified to generate a second oversampled train of digital pulses characterized by at least one of having a second digital pulse energy greater than the first digital pulse energy and having a larger number of pulses of the first digital pulse energy than the first oversampled train of digital pulses;

(c) the second digital pulse train is converted back to a second analog signal;

(d) the represented power and timing of a second representation of the first analog signal and the second analog signal being adjusted to achieve a good match at a subtractor;

(e) the timing and power adjusted representation of first and second analog signals are subtracted in the subtractor to generate a residue signal;

(f) the residue signal is converted to a corresponding digital representation; and (g) the corresponding digital representation is combined in a digital processor with the information in the first oversampled train of digital pulses to generate a digital signal that represents the first analog signal with greater precision than the information in the first oversampled train of digital pulses.

The conversion of at least one of the conversion of the first analog signal to a first oversampled train of digital pulse and the conversion of the residue signal to a corresponding digital may be based upon the natural quantization of magnetic flux in superconducting loops.

The corresponding apparatus may comprise an integrated inter-range data processor which amplifies a power of the first train of digital pulses, converts the second train of digital pulses to the second analog signal, and subtracts the first and second analog signals. The inter-range data processor may perform at least one function selected from the group consisting of integration, filtering, time-shifting, and carrier suppression.

A still further object provides an inter-range mixed signal processor comprising a digital amplifier adapted to produce a second logical representation having an associated second quantized energy per bit based on a first logical representation having an associated first quantized energy per bit, the second quantized energy per bit being higher by at least 6 dB than the first quantized energy per bit and transform the energy represented by the second logical representation into a first analog signal, a subtractor adapted to combine the first analog signal and a second analog signal to generate an analog difference signal.

The inter-range mixed signal processor may further comprise a logical array adapted to perform a logical function on a third logical representation and the first logical representation to produce the second logical representation.

The inter-range mixed signal processor may further comprise at least one of an analog filter and a digital filter, an integrator, and/or a time delay. These elements may be static, adjustable or controlled, or adaptively controlled, for example. Thus, for example, a time delay may be adaptively controlled to synchronize signals to achieve a maximum correlation therebetween.

These and other objects will become apparent from a review of the application as a whole, and the recited objects are not to be deemed limiting on the scope of the invention. The various functions and/or elements disclosed herein may be used separately, in the various feasible subcombinations and permutations, and/or together, without departing from the spirit and scope of the invention.

BRIEF DESCRIPTION OF THE DRAWINGS

The foregoing summary, as well as the following detailed description of the embodiments of the present invention, will be better understood when read in conjunction with the appended drawings. For the purpose of illustrating the invention, there are shown in the drawings embodiments which include those presently preferred. As should be understood, however, the invention is not limited to the precise arrangements and instrumentalities shown.

DETAILED DESCRIPTION OF THE PREFERRED EMBODIMENTS

Figure 1:
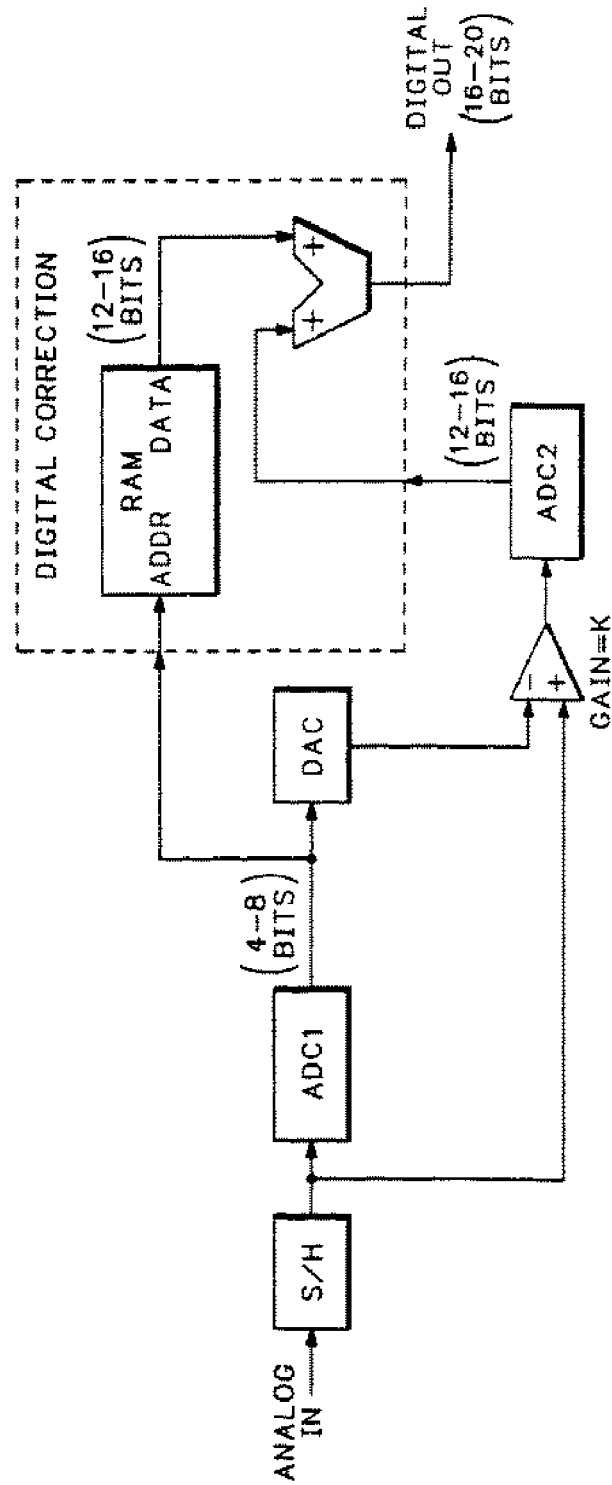
FIG. 1 shows a prior art block diagram of a generic subranging ADC.
Figure 2:
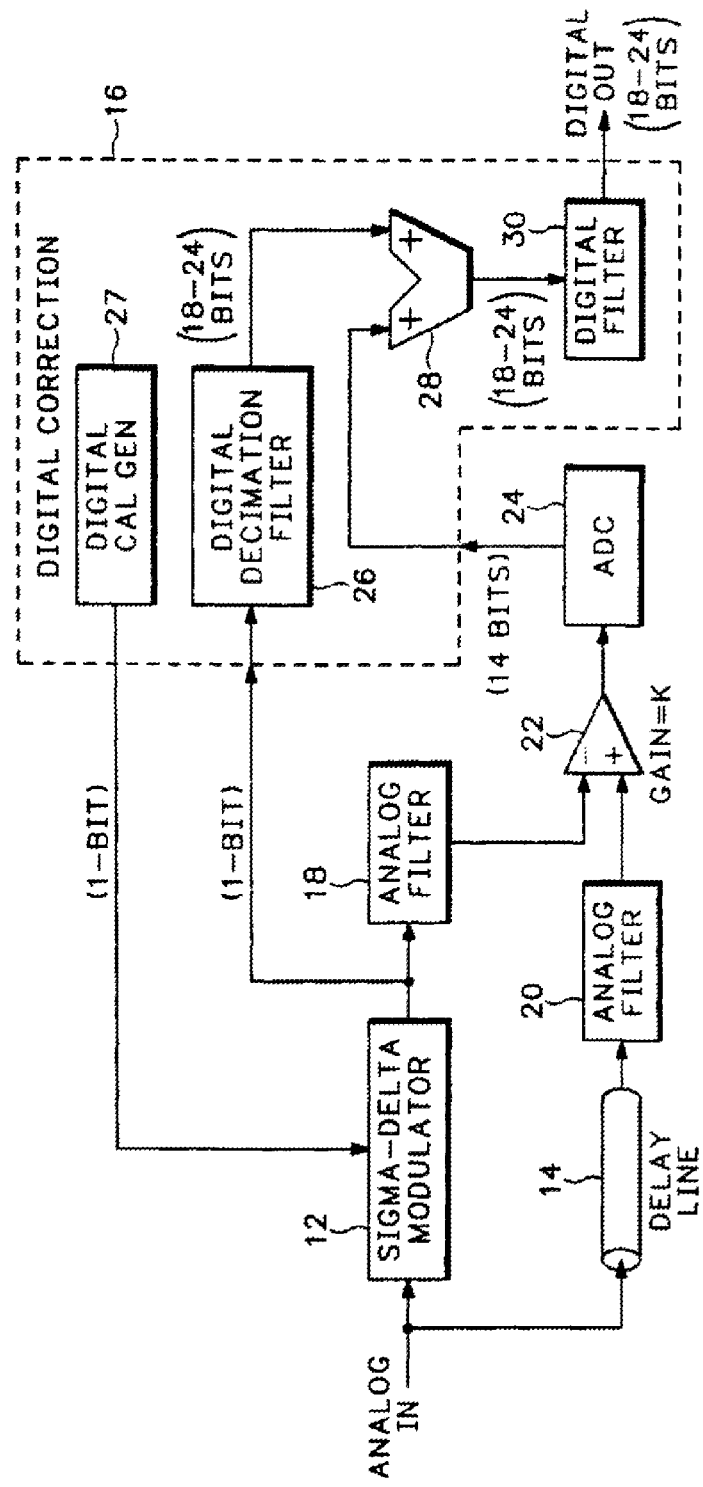
FIG. 2 shows a prior art block diagram of a subranging ADC that uses an oversampling sigma-delta modulator for the coarse ADC.
Figure 3:
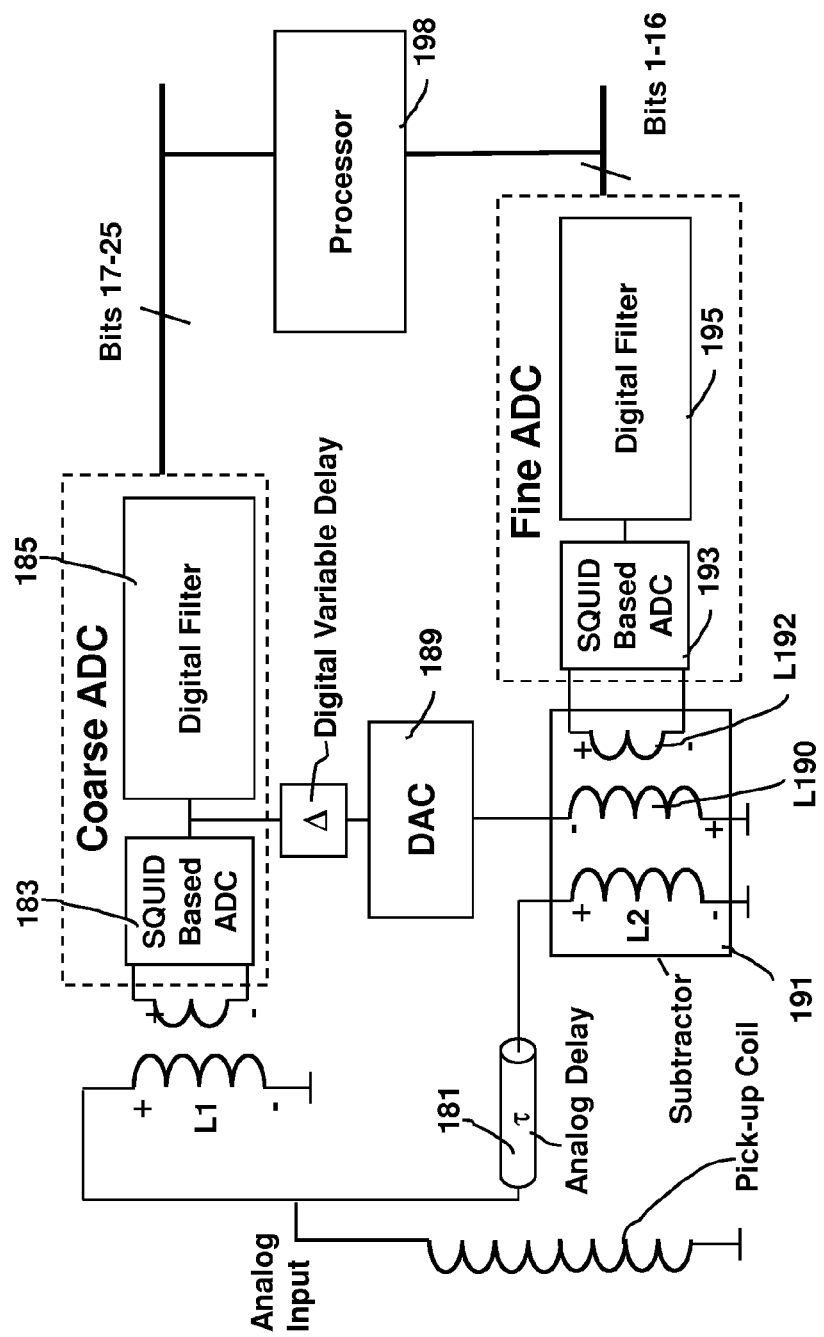
FIG. 3 shows a prior art conceptual block diagram of a subranging ADC that uses a SQUID-based ADC for both the fine ADC and the coarse ADC.

The subranging approach is widely used for high-performance ADCs to increase dynamic range. In a subranging ADC, the signal to be digitized is split, going to a coarse ADC and a fine ADC. The output from the coarse ADC is subtracted from the input, forming a residue signal that is essentially the coarse ADC's quantization error. Upon digitization of this residue signal with finer resolution in a fine ADC, we can sum the two ADC outputs and get cancellation of the coarse quantization error. Therefore, we simultaneously obtain the high maximum signal level of the coarse ADC and the fine quantization steps of the fine ADC, resulting in a much higher dynamic range than either ADC. In other words, the outputs from the coarse and fine ADC's form the most significant bits (MSB) and least significant bits (LSB) respectively of the subranging architecture.

With only one type of modulator, such as a low-pass delta modulator based on the principle of phase modulation-demodulation (PMD), we can obtain enhanced dynamic range by residue amplification. A typical modulator generates an oversampled 1-bit differential code that represents the discrete derivative of the input signal. This 1-bit oversampled code needs to be integrated first to reconstruct the digital equivalent of the input signal, and then averaged further and read out at the decimated rate to reduce the output bandwidth and increase the effective number of bits. These m bits form the most significant bits (MSB) of the subranging ADC. In order to extract the least significant bits (LSB), the oversampled single bit stream from the coarse ADC output is converted back to the analog domain in a DAC and subtracted from the input signal to generate a residue signal representing the error of the coarse ADC. The error signal is then digitized by the fine ADC to get the LSBs. Ideally, the residue signal has a dynamic range equivalent to the dynamic range of the fine ADC. In a known implementation of a subranging ADC, the residue signal is extremely small, and needs to be amplified to the full-scale range of the fine ADC. The n-bit digital output of the fine ADC is divided by the amplification factor and summed with the coarse ADC output to yield a digital output with a larger dynamic range (more effective bits).

Instead of amplifying the analog residue, one can move the amplification before the subtraction function in the digital domain. To do this, we divide the signal between the two ADCs (FIG. 4), coupling a small fraction to the coarse ADC and the rest to the fine ADC. Thus, the division is typically unequal, thus supporting a large dynamic range for each of the coarse and fine ADCs. Now, the coarse ADC output needs to be amplified by the same factor (K) to match the amplitude of the analog signal being applied to the subtractor. In a preferred embodiment, the interface between the two ADCs, called the inter-range mixed-signal processor, performs several signal processing functions: subtraction, filtering, amplification, and in the case of using a delta modulator in the coarse ADC, integration. The amplification and filtering functions can be done in both analog and digital domains. Digital amplification, or multiplication, ensures linearity, and is particularly preferred. Additional digital processing to compensate for nonidealities of subsequent analog components, such as the subtractor, may also be performed in the digital domain. The analog filter performs digital-to-analog conversion of the single-bit oversampled data stream; no explicit device is needed. Following digital integration and filtering, the coarse ADC output is multiplied by K and summed with the similarly processed fine ADC output.

Figure 4A:
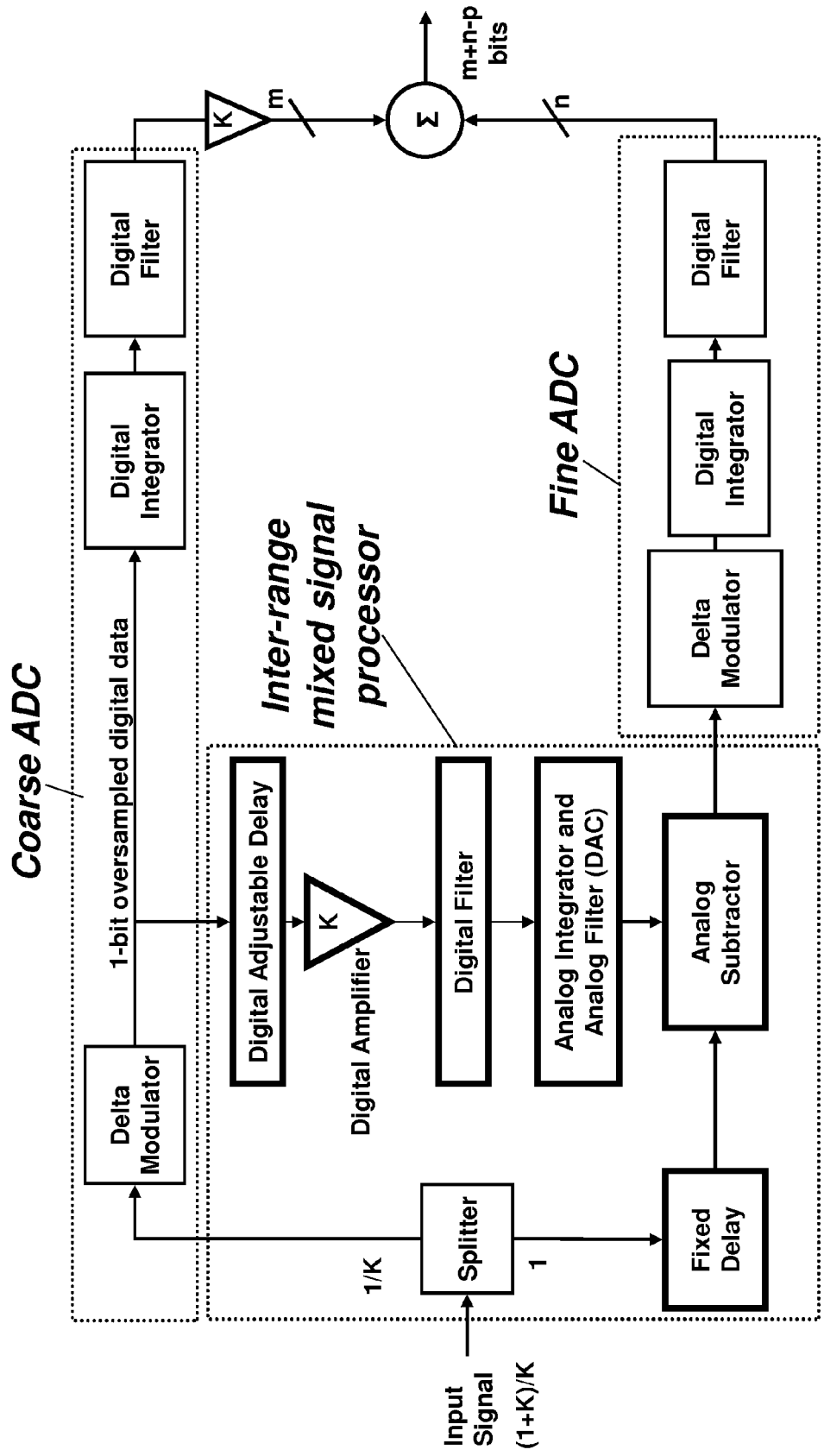
FIG. 4A shows a block diagram of an embodiment of a subranging ADC, comprising two oversampled delta modulators for the two ranges and an inter-range mixed-signal processor.
Figure 4B:
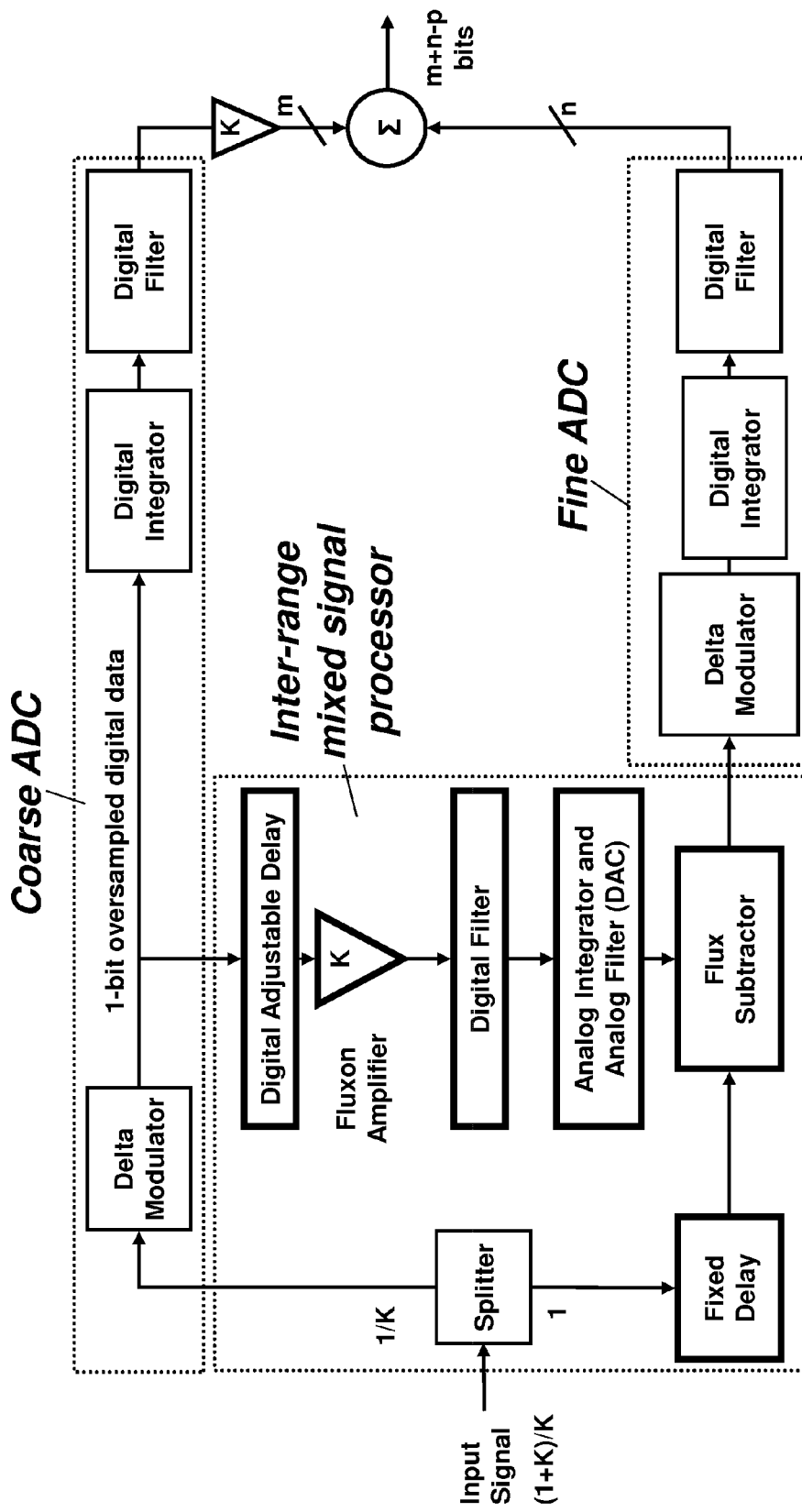
FIG. 4B shows a block diagram of an embodiment of a superconductor subranging ADC, comprising two oversampled delta modulators for the two ranges, each producing an output in the form of a stream of single flux quanta, and a corresponding inter-range mixed-signal processor, comprising a fluxon amplifier and a flux subtractor.

Superconductor low-pass delta modulators have demonstrated high linearity in data conversion. FIG. 4B shows a subranging ADC comprising two delta modulators (See Reference 4). The output of such a delta modulator is a stream of single flux quantum pulses. The corresponding inter-range mixed-signal processor includes a fluxon amplifier and a flux subtractor. Any other digital processing, such as filtering, of the coarse ADC's delta modulator will have to be performed with appropriate digital logic, such as rapid single flux quantum logic (RSFQ). Our current preferred implementation of a superconductor delta modulator uses the phase modulation-demodulation (PMD) architecture (Reference 4). The PMD delta modulator uses a stream of flux quanta at half the maximum fluxon transport rate of one $\Phi_0$ every clock period as the phase modulation carrier. In the simplest case, this carrier is generated by pumping flux in the phase modulator circuit at half the sampling clock rate ($f_{clk}/2$). The flux pump allows unipolar digital coding: when the input signal is absent the output is a pattern of alternating 1's and 0's, when the input signal is present the output has more 1's (0's) when the signal derivative is positive (negative). Therefore, this carrier must be subtracted before subtraction from the analog input signal.

Figure 4C:
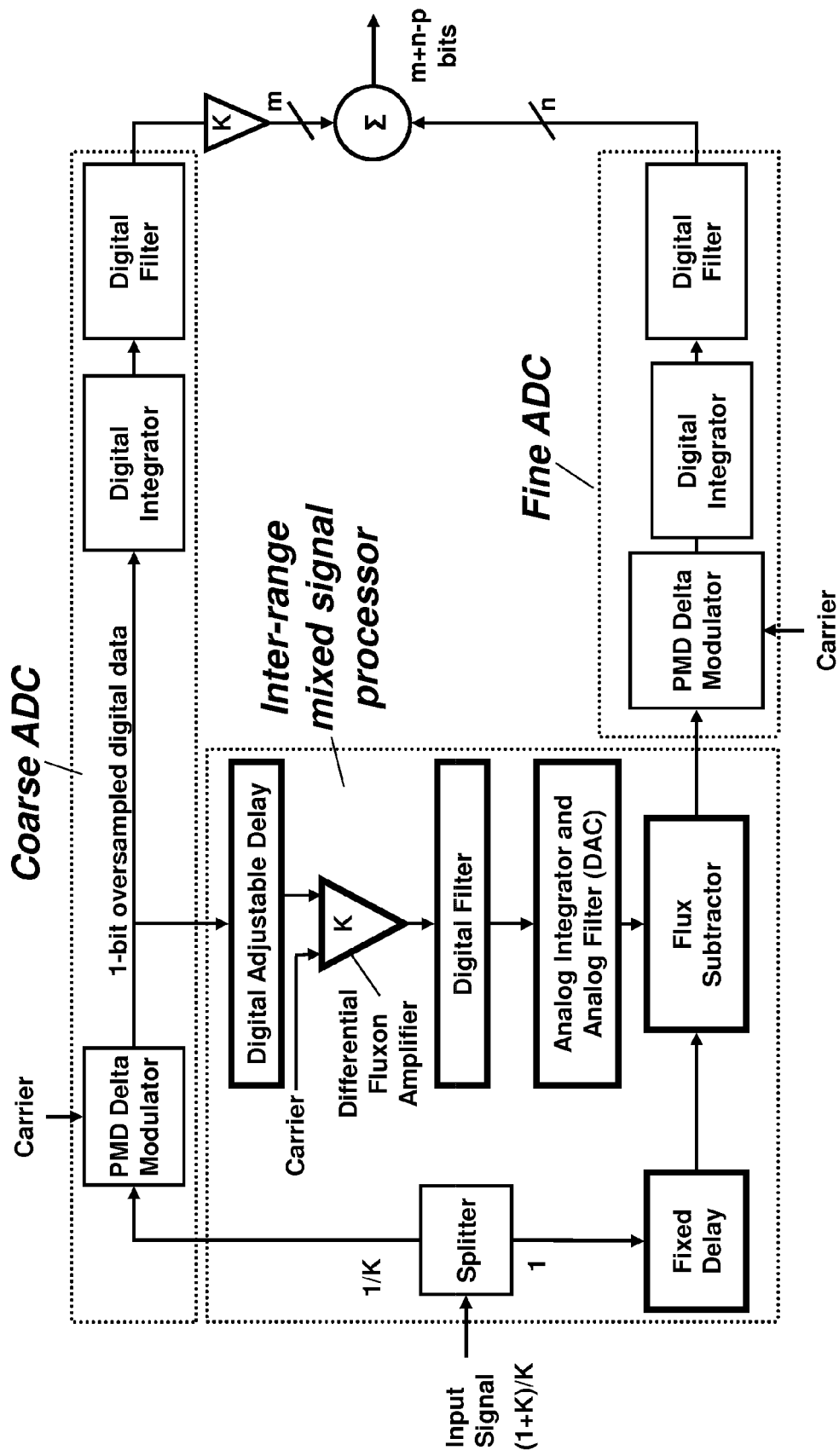
FIG. 4C shows a block diagram of an embodiment of a superconductor subranging ADC, comprising two oversampled phase modulation-demodulation (PMD) delta modulators for the two ranges, each producing an output in the form of a stream of single flux quanta, and a corresponding inter-range mixed-signal processor, comprising a differential fluxon amplifier to subtract the phase modulation carrier from the coarse ADC.
Figure 4D:
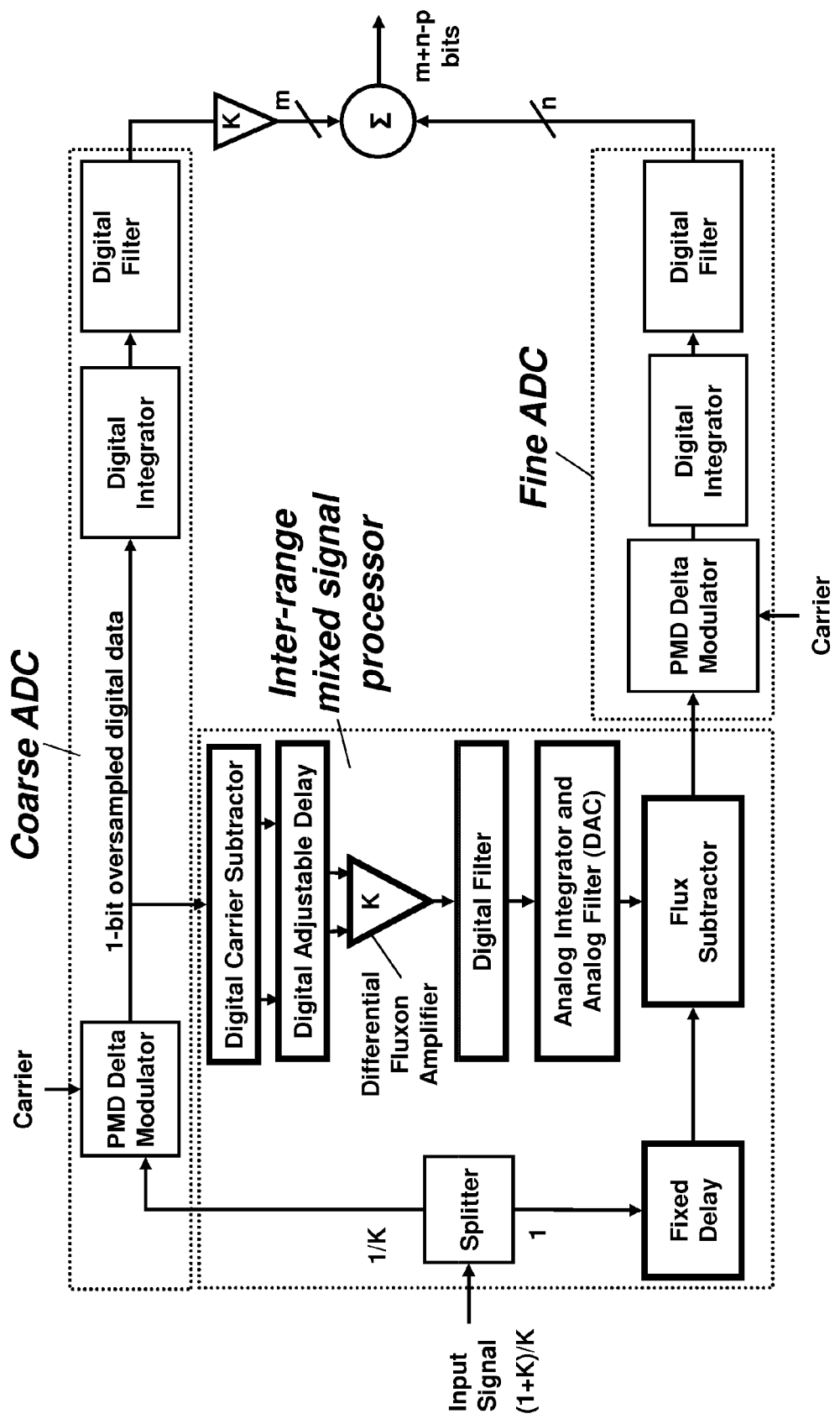
FIG. 4D shows a block diagram of an embodiment of a superconductor subranging ADC, comprising two oversampled phase modulation-demodulation (PMD) delta modulators for the two ranges, each producing an output in the form of a stream of single flux quanta, and a corresponding inter-range mixed-signal processor, comprising a digital carrier subtractor and a differential fluxon amplifier.

One method of doing this is to construct a differential fluxon amplifier that receives the coarse ADC's PMD delta modulator output and a copy of the carrier (or flux pump) at its two differential inputs (FIG. 4C). Another method of subtracting the carrier is to do it digitally and generate two differential unipolar streams (FIG. 4D).

The subtraction function is performed by subtracting magnetic flux produced by the analog input and the amplified digital output from the coarse ADC's PMD delta modulator using a set of coupled coils. For example, we can construct three sets of coils, the first carrying the analog input signal, the second carrying the output of the digital fluxon amplifier, and the third carrying the residue into a fine ADC; the coupling of the first (pick-up coil) and the second (fluxon injector coil, which may comprise multiple taps) to the third (residue coil) must have opposite sense for subtraction. The digital amplifier produces a bipolar signal of magnitude $K\Phi_0/2$ of either polarity and injects the corresponding flux into a residue coil.

Figure 5:
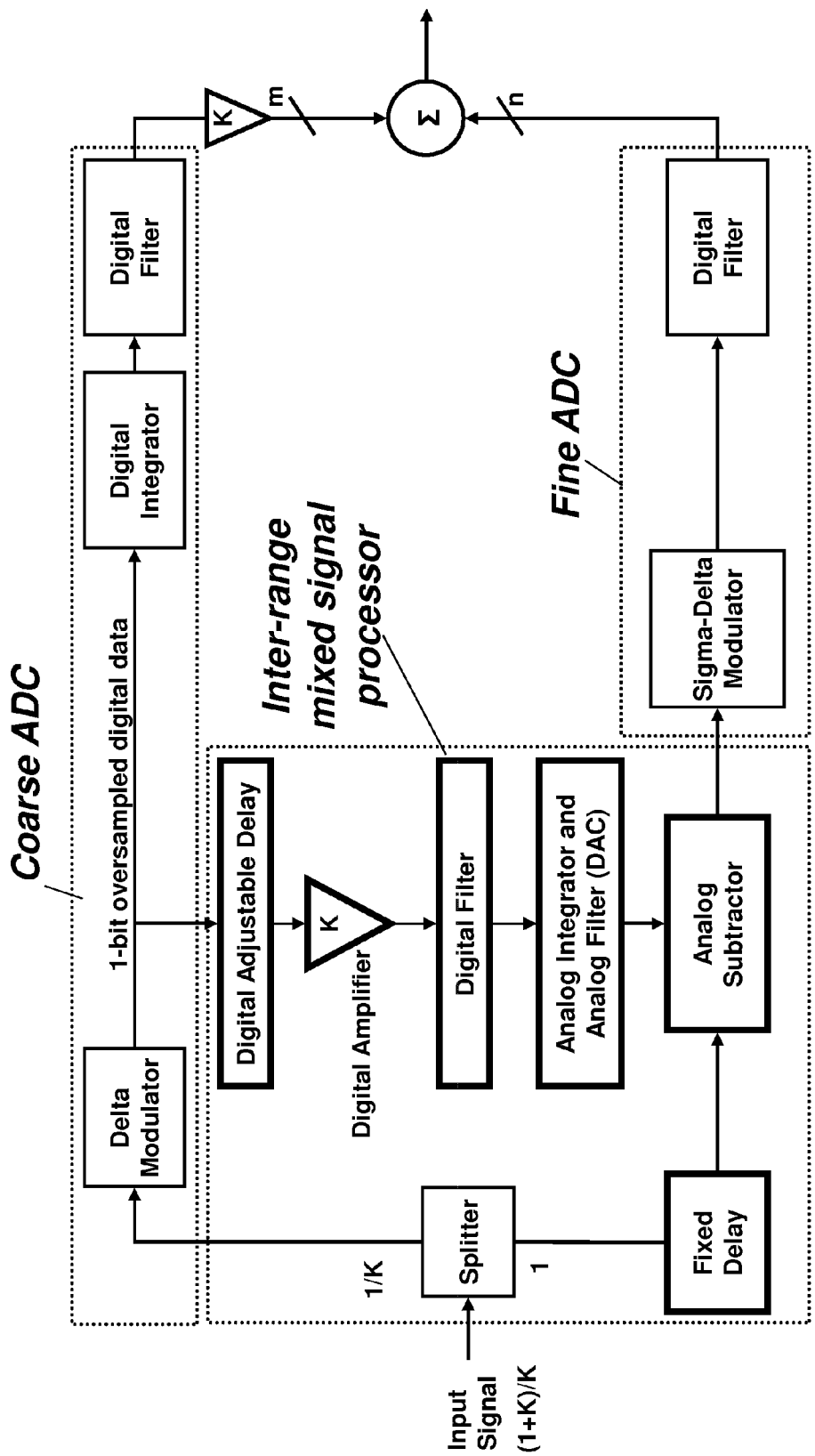
FIG. 5 shows a block diagram of a preferred embodiment of a subranging ADC, comprising an oversampled delta modulator for the first (coarse) ADC range, an oversampled sigma-delta modulator for the second (fine) ADC range and an inter-range mixed-signal processor.

The effect of unfiltered quantization noise is particularly severe on a delta ADC, since the slew-rate contribution is proportional to the frequency of the noise component extending all the way up to $f_{clk}/2$, which may be 2-3 orders of magnitude higher than the RF signals-of-interest. If we set a performance criterion of 90-dB SNR in 10-MHz bandwidth, a $2^{nd}$-order low-pass filter is adequate for input frequencies less than 200 MHz. Over 200-MHz, the filtering requirement for a delta+delta subranging ADC will be severe (requiring a $7^{th}$ order bandpass filter for f=500 MHz, according to initial simulations). One way of avoiding this required level of filtering is to use a delta-sigma modulator, which is not slew-rate limited, as the fine ADC (FIG. 5).

Figure 6:
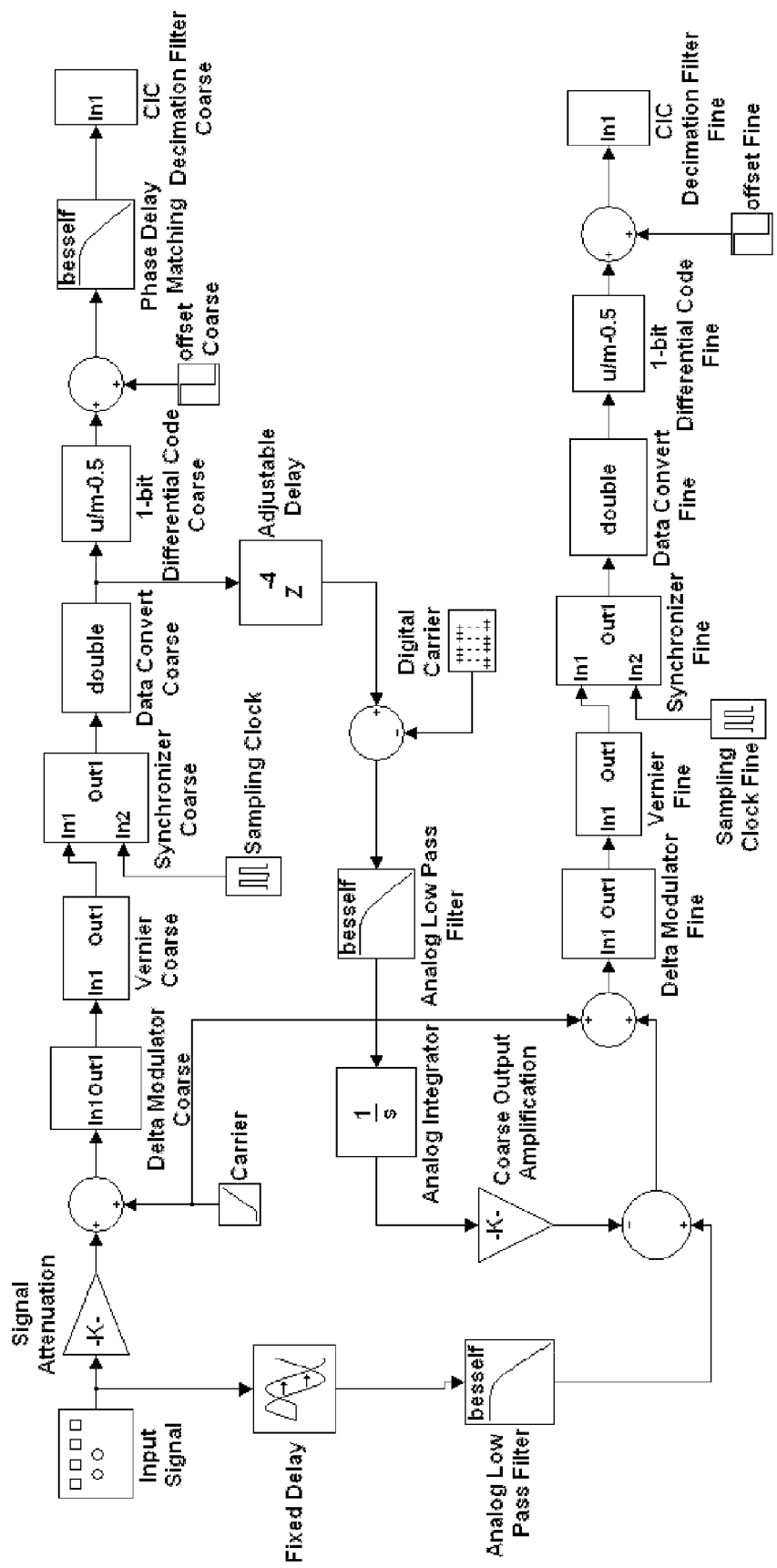
FIG. 6 shows a Simulink model for low-pass subranging ADC using phase modulation-demodulation delta modulators for both coarse and fine ranges.

A functional MATLAB Simulink model, as shown in FIG. 6, was developed for the subranging architecture and used to carry out simulations to anticipate the improvement in performance of a two-range subranging ADC over a single-range ADC, using two identical low-pass PMD delta modulators.

As seen from FIG. 6, the output from the coarse ADC is passed through a low-pass Bessel filter and integrated in an analog integrator. To match delay and amplitude attenuation, the analog input signal is also filtered before being applied to the fine ADC. The phase modulation carrier is subtracted also. The resultant signal is amplified and then subtracted from the analog input before being digitized by the second (fine) ADC. The oversampled data from the coarse and fine ADC are integrated and averaged further in a digital decimation filter. The coarse ADC output needs to be delayed to compensate for the delay through the inter-range mixed-signal processor before being summed with the fine ADC output.

Figure 7A:
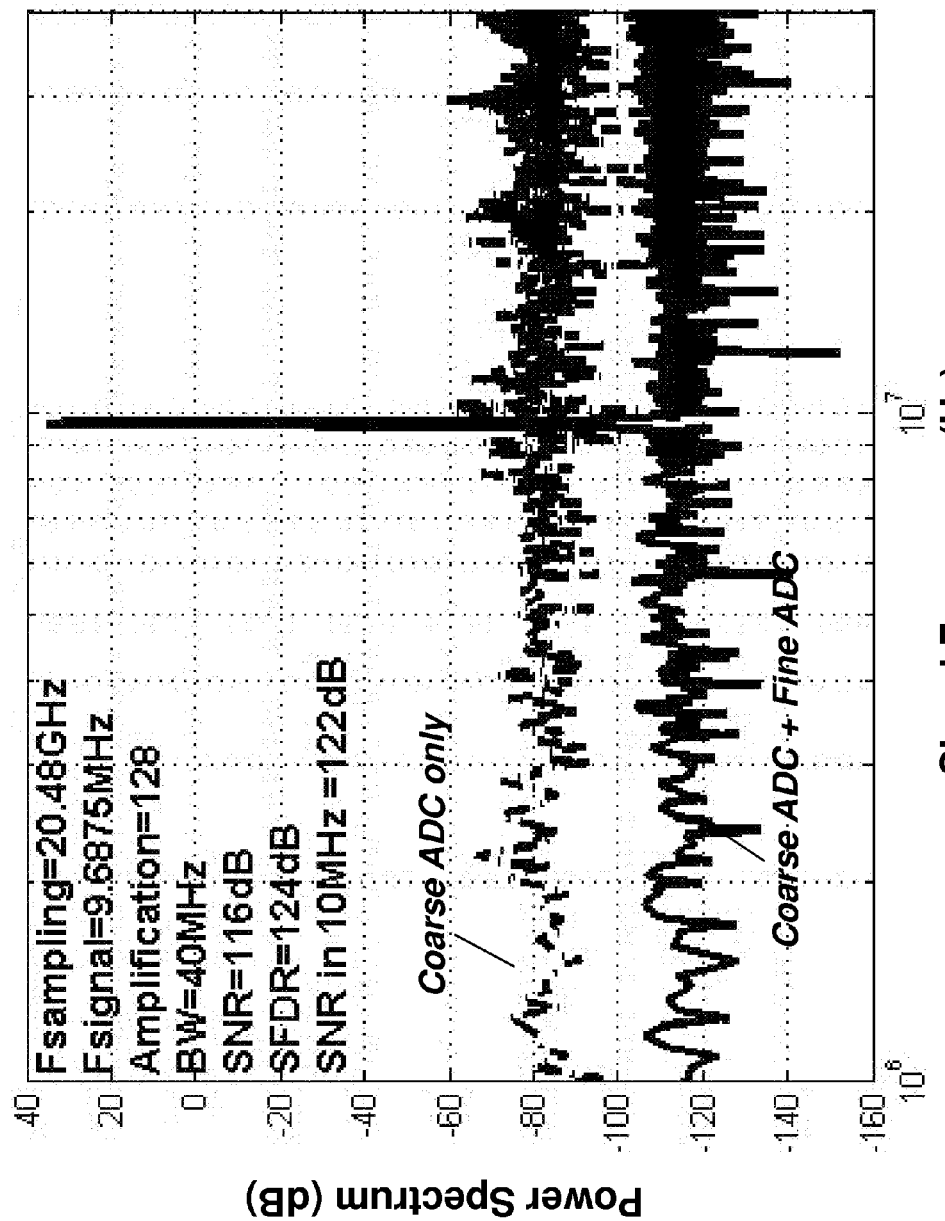
FIG. 7A shows a simulated power spectrum for the phase modulation-demodulation delta ADC and phase modulation-demodulation subranging delta ADC. The spectrum is for 9.7 MHz sine wave being sampled at 20.48 GHz. The output bandwidth is 40 MHz.
Figure 7B:
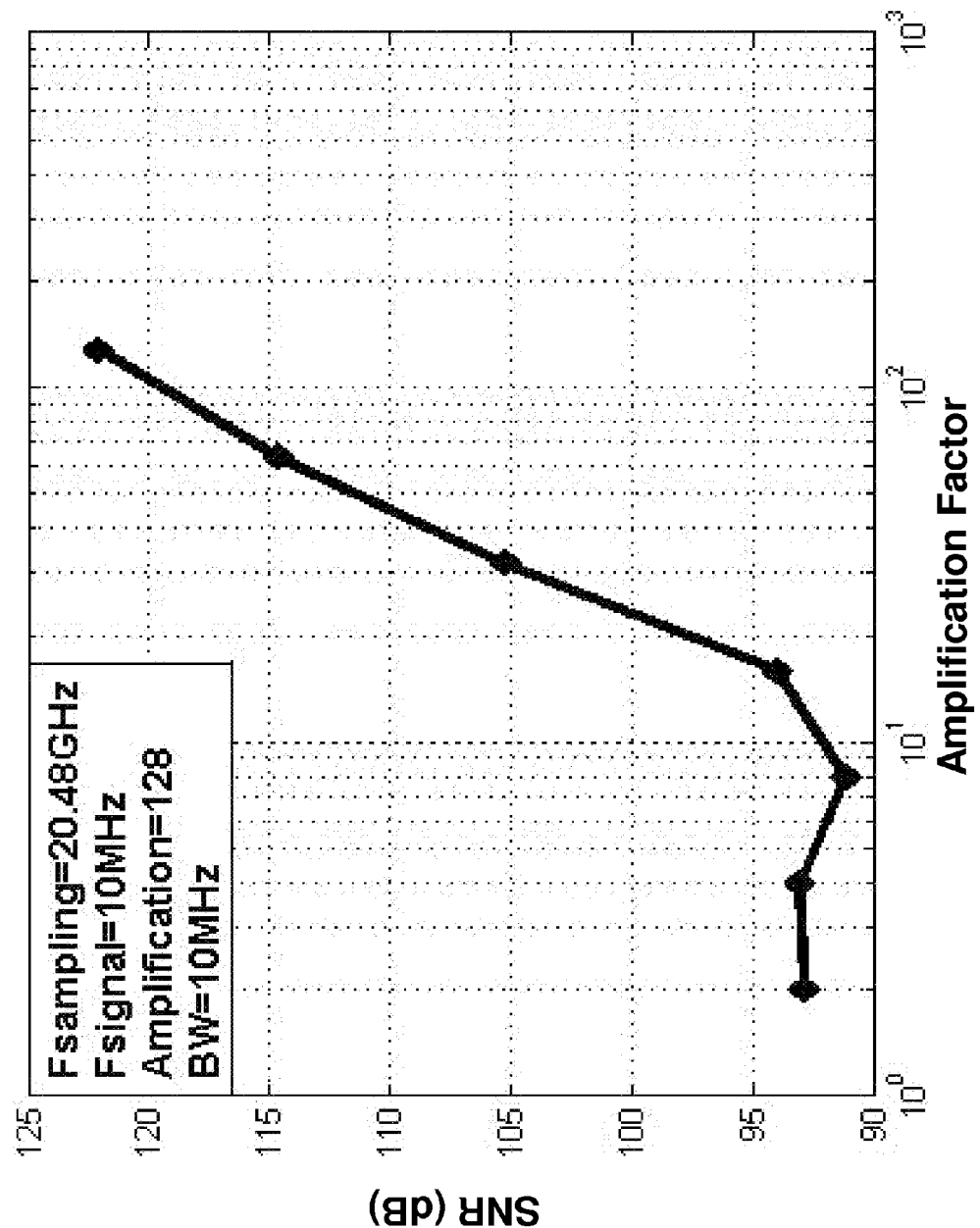
FIG. 7B shows the SNR of subranging ADC as a function of amplification factor (K) of the coarse ADC output for a 9.7 MHz sine wave being sampled at 20.48 GHz.

FIG. 7A shows the simulated power spectrum for the phase modulation-demodulation delta ADC and phase modulation-demodulation subranging delta ADC. The spectrum is for a 9.6875 MHz sine wave being sampled at 20.48 GHz and decimated by a factor of 256. The cutoff frequency of the analog low-pass filter is 80 MHz. The amplification factor (K) is 128. As seen from FIG. 7A, the noise floor of the subranging ADC is significantly lower than that of the regular low-pass PMD ADC. At the signal peak, the two traces overlap, confirming correct operation. Both the coarse and fine ADCs use a single channel synchronizer (Reference 4). FIG. 7B plots the calculated signal-to-noise ratio (SNR) as a function of the amplification factor (K). For lower amplification values (up to 8), the performance of the subranging ADC is similar to that of the single modulator ADC. One plausible explanation is that the amplitude attenuation in the lowpass filter nullifies any performance enhancement. For simulation, a simple Bessel filter from the Simulink tool box was employed. Improved design of the analog filter, reducing the passband attenuation, would enable enhanced SNR even for lower amplification ratios.

Figure 8:
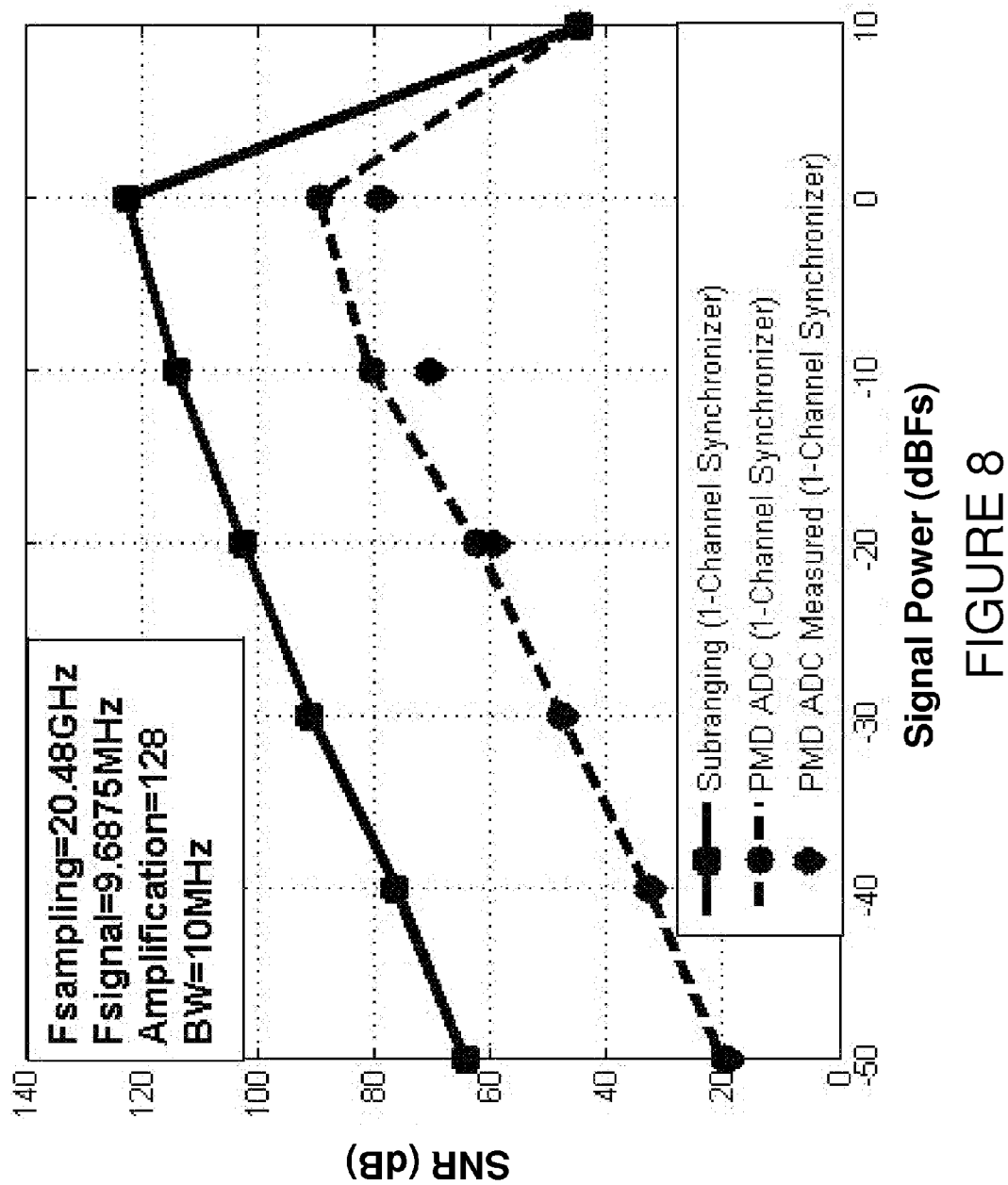
FIG. 8 shows the SNR vs. signal power for the phase modulation-demodulation delta ADC and phase modulation-demodulation subranging delta ADC. The spectrum is for 9.7 MHz sine wave being sampled at 20.48 GHz.

FIG. 8 plots the SNR for a PMD delta ADC and a two-range PMD delta subranging ADC as a function of the signal power (in dB full scale). To justify the accuracy of simulation, measured results for the PMD ADC are also plotted. The measured results are in close agreement with the simulated performance. The subranging ADC shows a 32 dB gain in SNR at signal power close to the slew rate limit. The simulation does not take into account implementation losses like the imperfections in phase delay matching which might drop the projected gain in performance; however, a digitally controlled phase delay network may be employed as necessary (not shown in the figures), and therefore this is not an insurmountable practical limitation in implementation. Such a delay network may be adaptive, especially if there is an overlay in the range of the coarse and fine ADC, since this permits a correlator to find and maintain an ideal phase delay to maximize the correlation of the lower coarse ADC bits and upper fine ADC bits in the overlapping range. Typically, a controllable phase delay network would not be required, and a fixed delay in a static design would suffice.

Figure 9A:
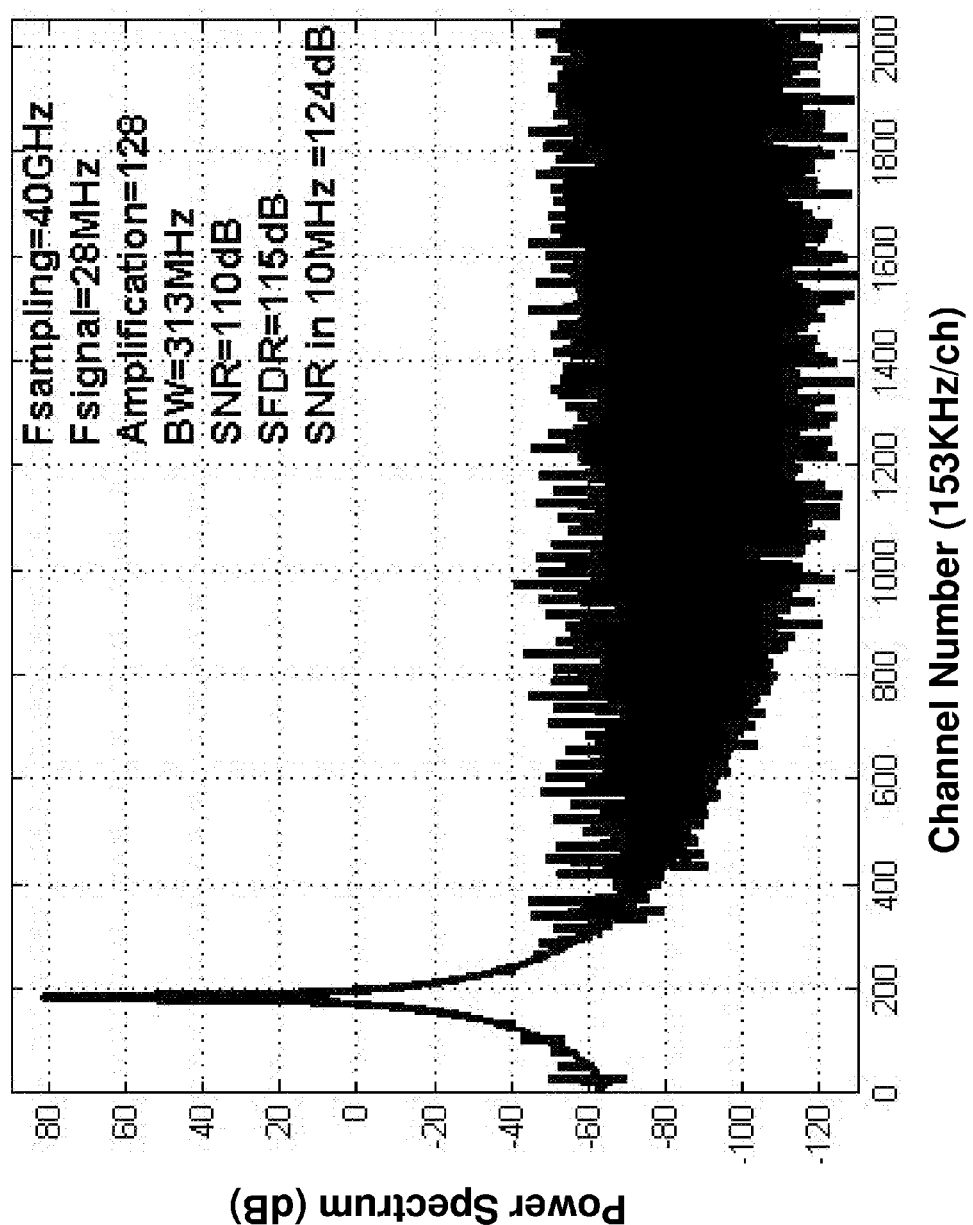
FIG. 9A shows the simulated spectra for 28 MHz signals with 40-GHz sampling frequency and an amplification factor (K) of 128.
Figure 9B:
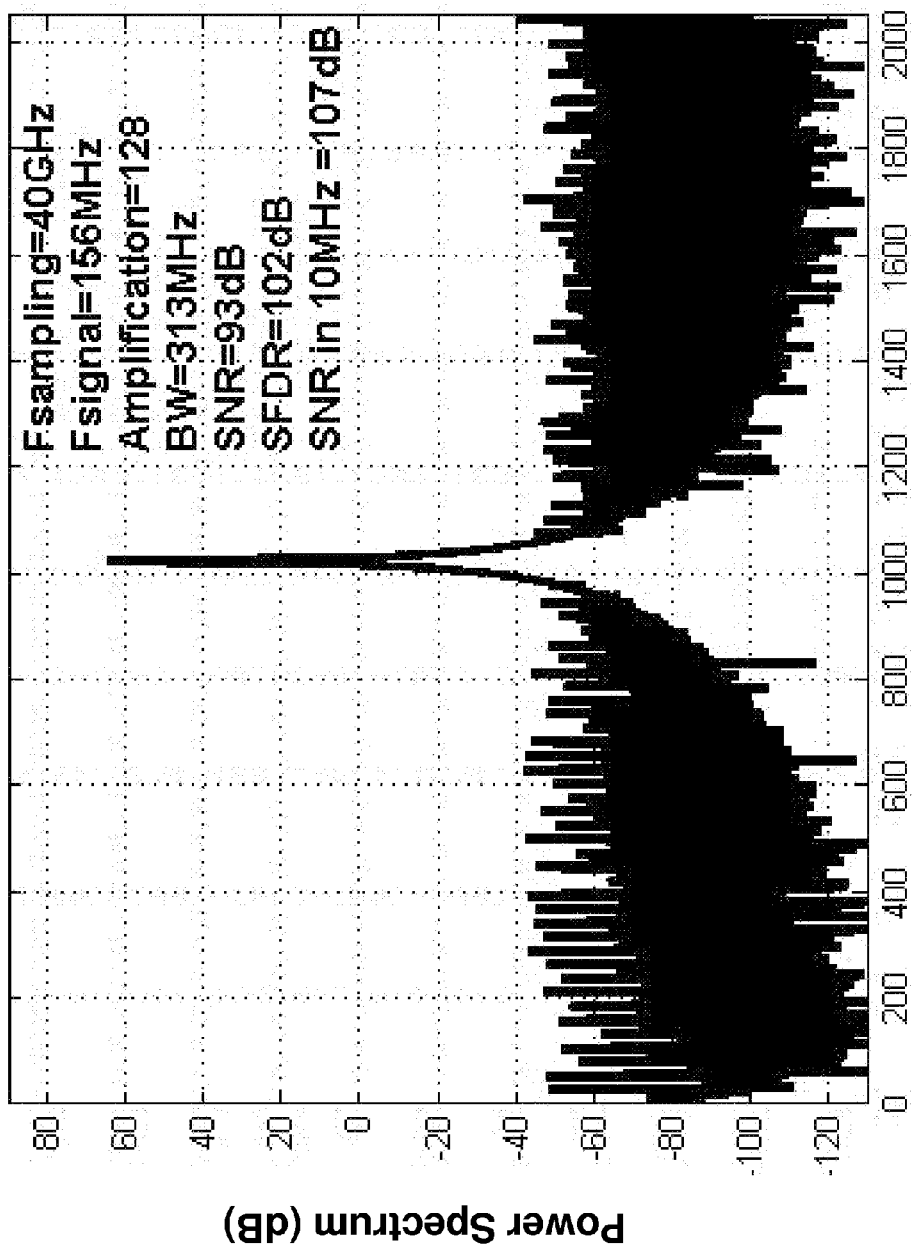
FIG. 9B shows the simulated spectra for 156 MHz signals with 40-GHz sampling frequency and an amplification factor (K) of 128.
Figure 10:
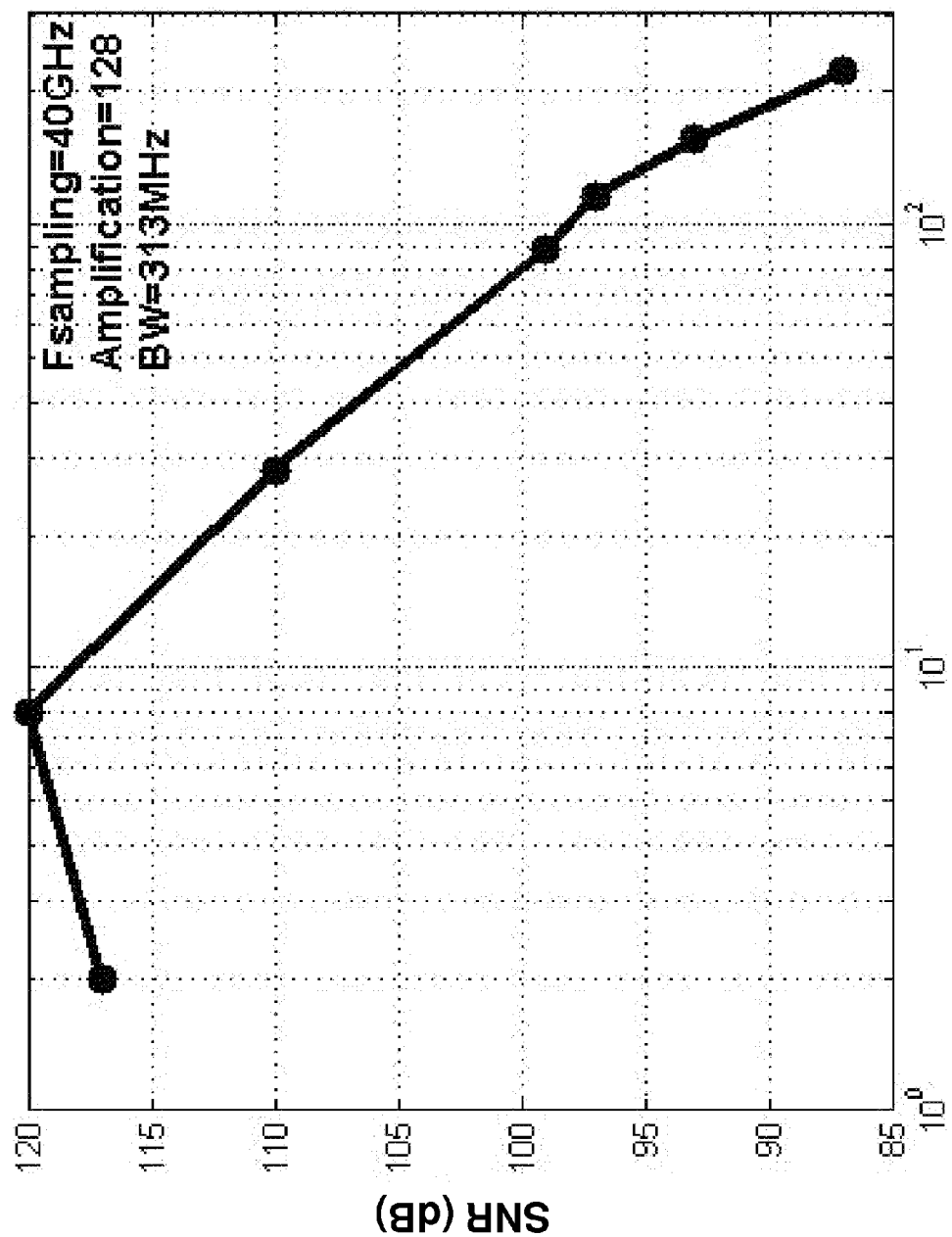
FIG. 10 shows the SNR performance in 313 MHz bandwidth for a coarse ADC comprising a PMD delta modulator and a fine ADC comprising another PMD delta modulator with clock 40 GHz and the amplification factor of 128.

FIGS. 9A and 9B show the simulated power spectra for a 28 MHz and a 156 MHz sinusoidal input respectively, both clocked at 40 GHz with an amplification factor (K) of 128. The two-range PMD delta subranging ADC is slew-rate limited. Therefore, its SNR drops as the input analog signal frequency is increased. FIG. 10 shows a plot of the SNR in the full output bandwidth of 312.5 MHz ($f_{clk}$/2R, where the sampling clock frequency $f_{clk}$ is 40 GHz and the decimation ratio R is 64), as a function of input analog signal frequency.

Figure 11:
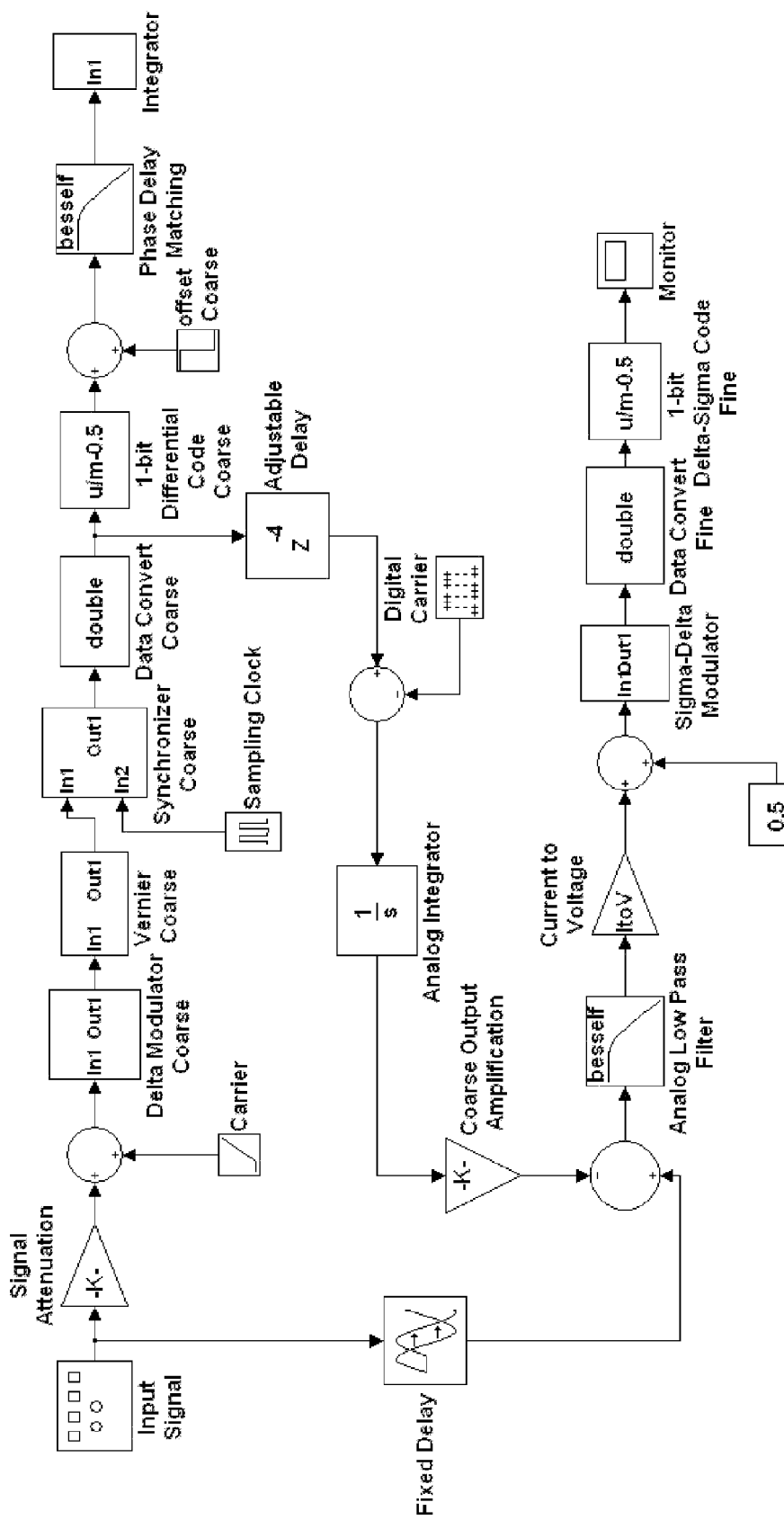
FIG. 11 shows a Simulink model for a low-pass subranging architecture using delta modulator for the coarse ADC and sigma-delta modulator for the fine ADC.

Another subranging ADC implementation, substituting the delta modulator with a sigma-delta modulator in the fine ADC, improves the performance at higher analog signal frequency. FIG. 11 shows the corresponding MATLAB Simulink model. A second-order low-pass Bessel filter is used to reject out-of-band quantization noise. In order to avoid phase mismatch between coarse ADC output and analog input signal due to the low-pass filter, the filter is moved after the subtractor. A compensating delay is inserted in the coarse ADC output path to avoid misaligned phases while summing the coarse and fine ADC outputs. A current-to-voltage converter converts the residue current to voltage which is further digitized by the sigma-delta modulator. The coarse and fine ADC outputs are added in software and their spectra are analyzed.

Figure 12A:
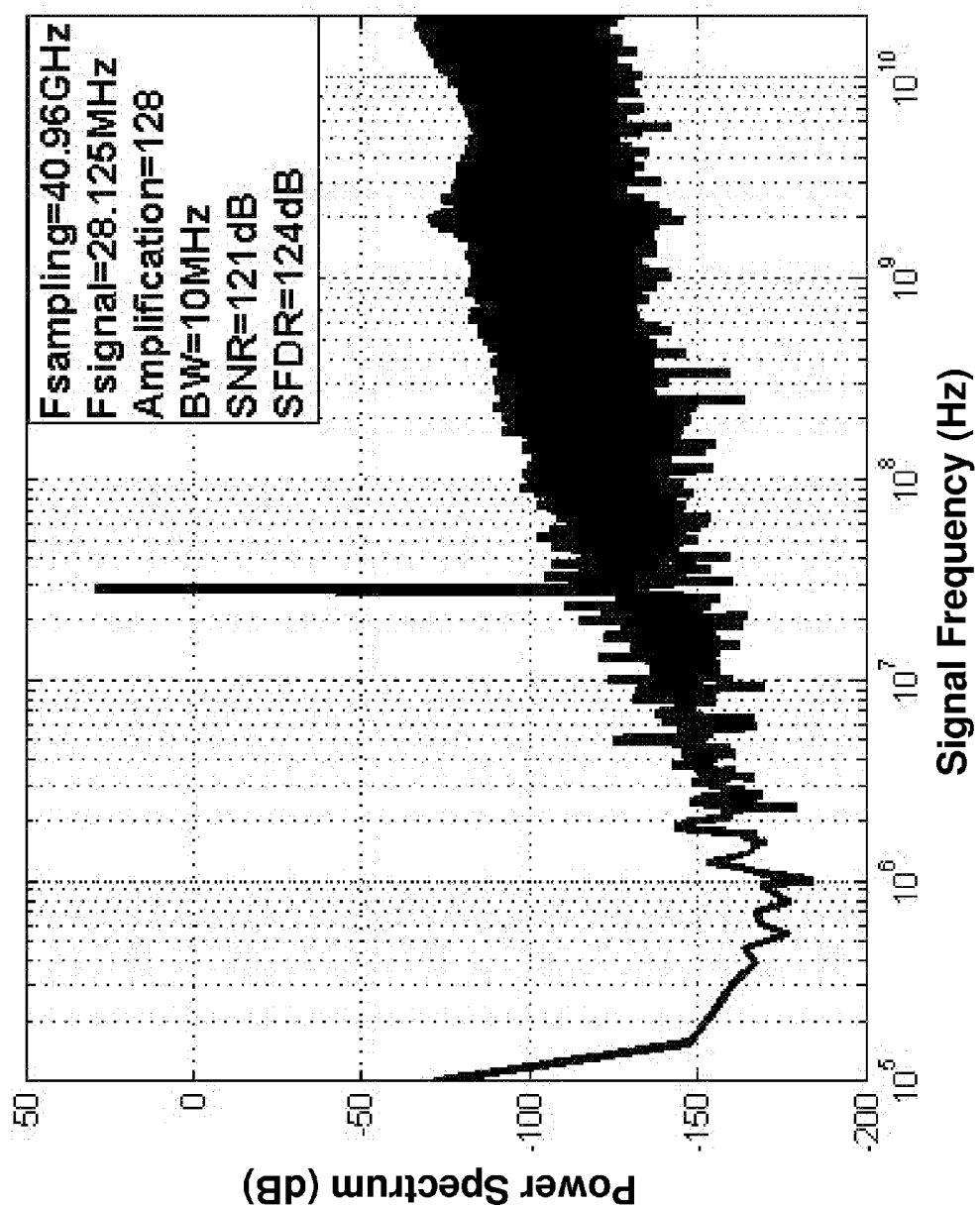
FIGS. 12A, 12B and 12C show, respectively, the simulated spectrum for input signals of 28.125 MHz, 276.875 MHz, and 476.875 MHz, sampled with a 40.96 GHz clock and an amplification factor of 128.
Figure 12B:
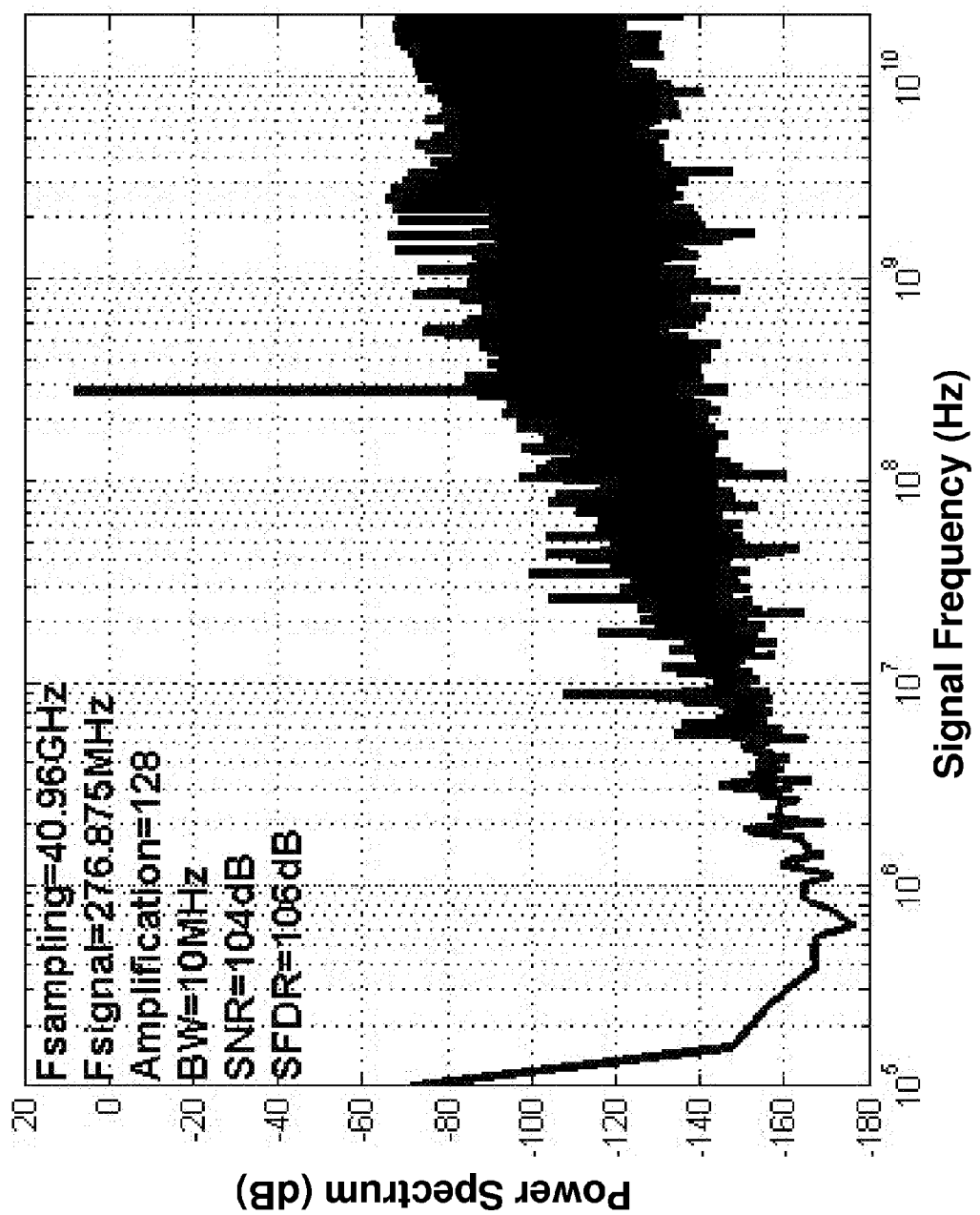
Figure 12C:
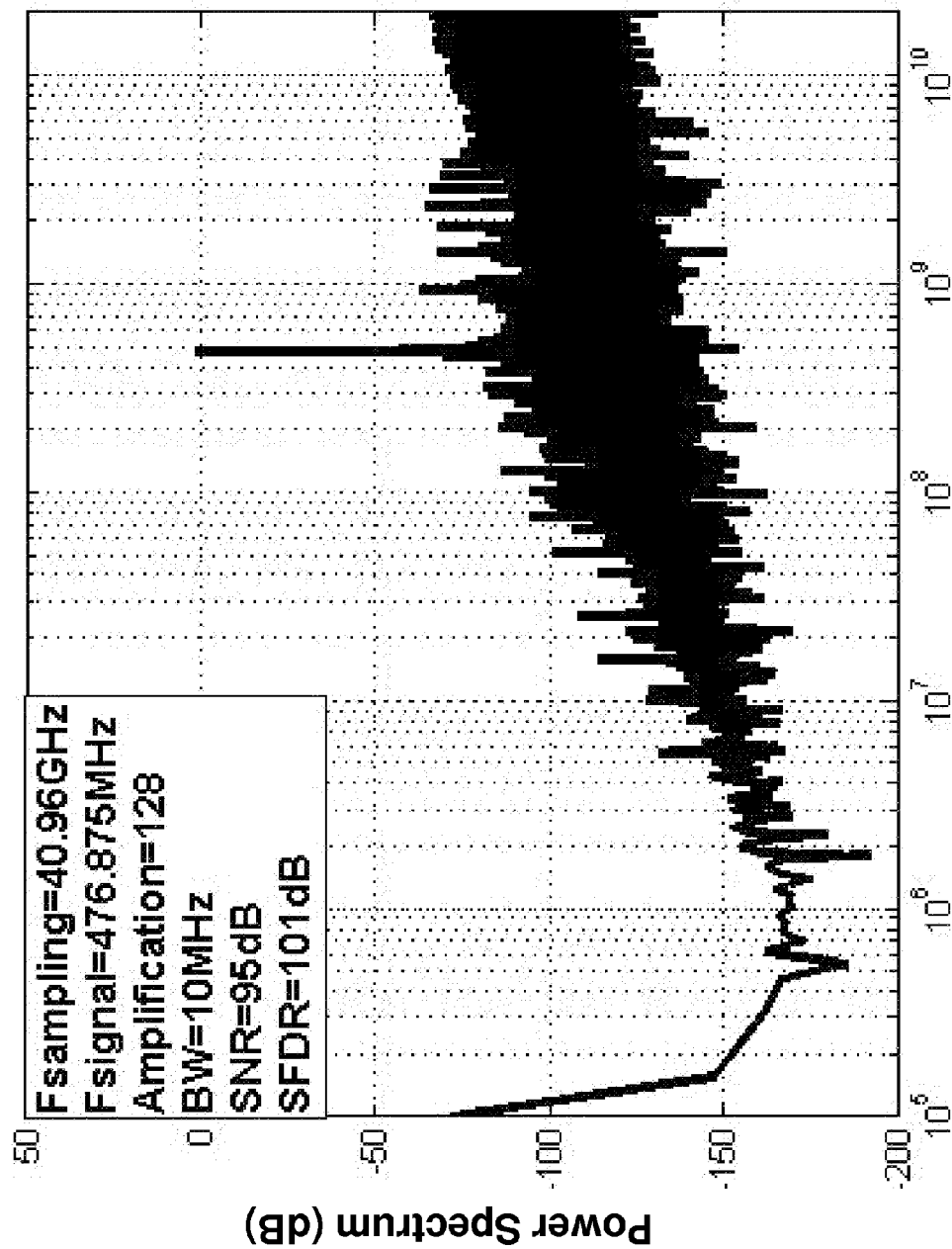
Figure 13:
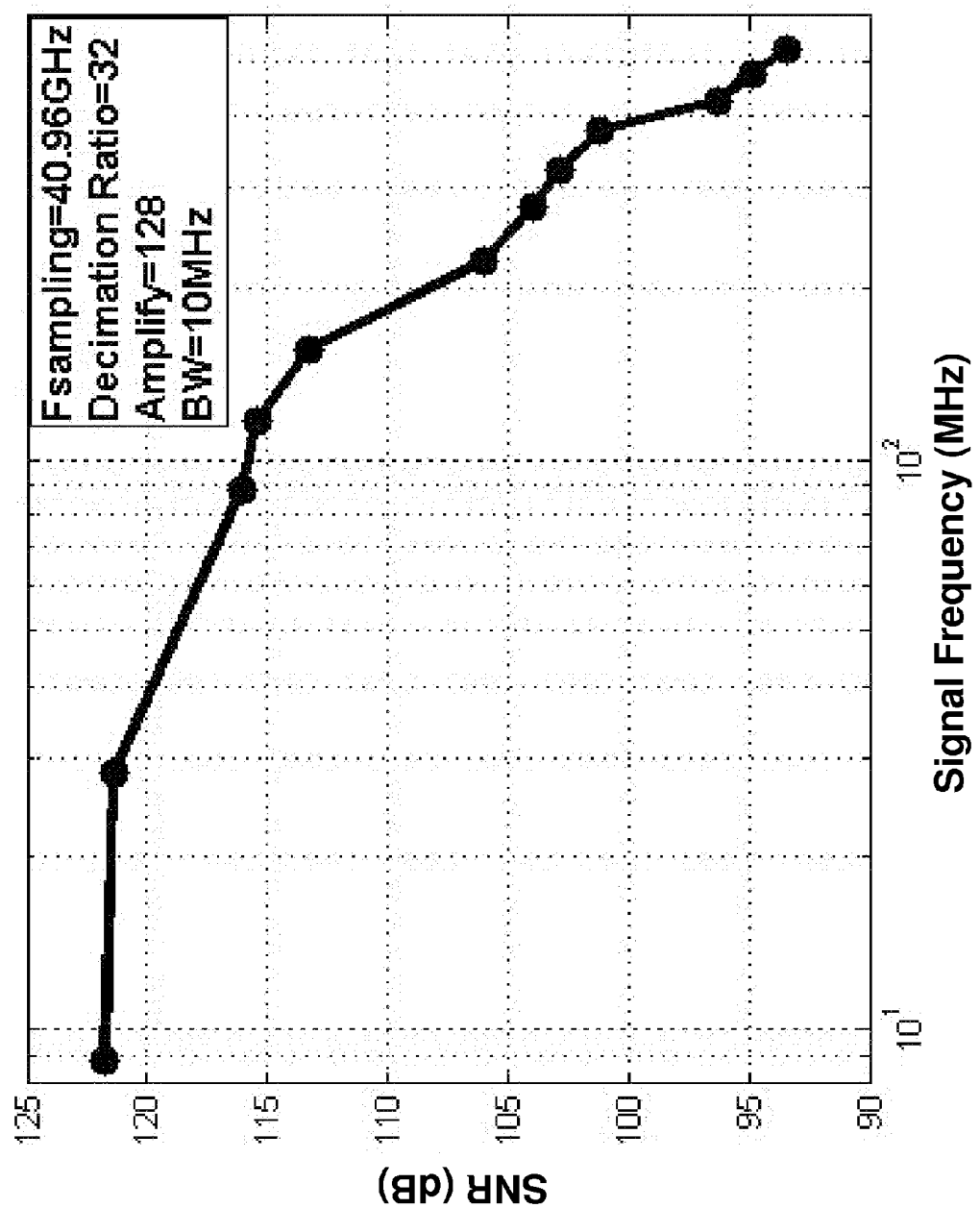
FIG. 13 shows the SNR performance in 10 MHz BW for the low-pass subranging ADC with a coarse ADC comprising a PMD delta modulator and a fine ADC comprising a sigma-delta modulator with clock 40.96 GHz and an amplification factor of 128.

Extensive simulations of the subranging ADC architectures were carried out using a delta PMD ADC modulator for the coarse and a delta-sigma modulator for the fine sections of the subranging ADC. Simulation for input frequencies 8, 28, 88, 116, 156, 223, 273, 323, 377, 423, 477, 523 MHz was performed. Simulations were done for clock frequencies of 40.96 GHz and amplification coefficients of 128. Representative spectra (FIGS. 12A, 12B, and 12C) and a summary of SNR as a function of signal frequency with 10 MHz instantaneous bandwidth (FIG. 13) are shown.

The inter-range mixed-signal processor performs several functions: subtraction, amplification, integration, filtering, and delay.

Figure 14A:
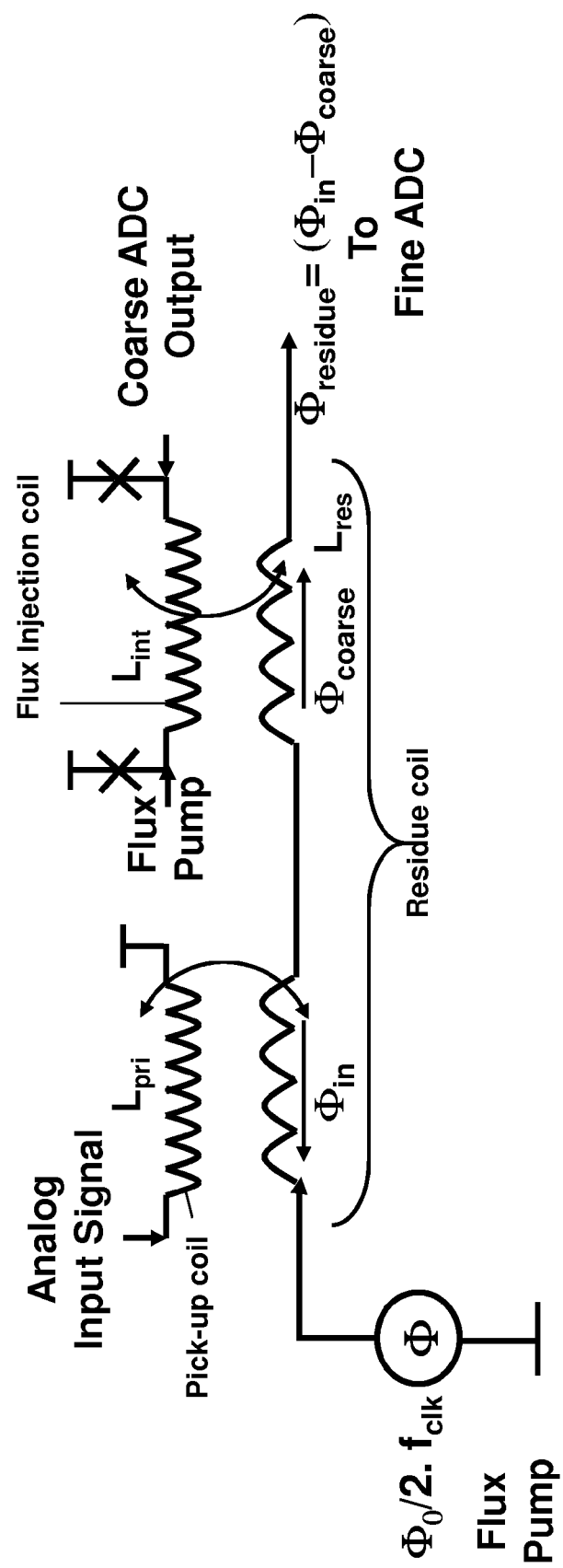
FIG. 14A shows the flux subtractor comprising multiple transformers connected in a common loop, in which the inversion of the coarse ADC output is achieved by reversing the winding of the coupling coil; for a PMD ADC, the phase modulation carrier or the flux pump is subtracted to generate a bipolar waveform.
Figure 14B:
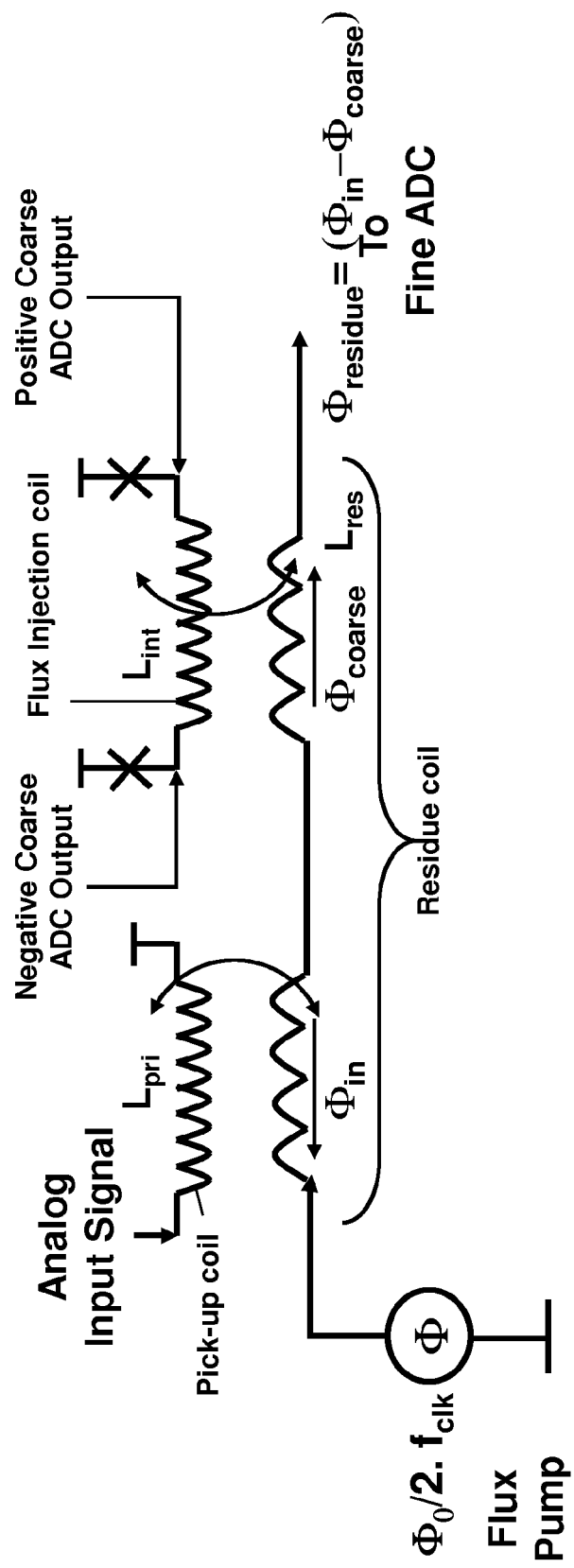
FIG. 14B shows the flux subtractor corresponding to the digital carrier subtraction scheme depicted in FIG. 4D.

The basic concept of a flux subtractor is shown in FIG. 14A. The analog input and the coarse ADC outputs are inductively coupled to two serially connected coils with opposite polarity. The difference or the residue signal, $\Phi_{residue}=\Phi_{in}-\Phi_{coarse}$, is fed to the fine ADC. The raw single-bit oversampled coarse delta ADC output needs to be integrated first to reconstruct the input signal. Furthermore, in a PMD ADC, a carrier signal (called flux pump) is added to the input at the rate of $\Phi_0 f_{clk}/2$. This may be thought of as an offset 'ramp' which upon integration yields a dc offset equal to half of full-scale. Before subtraction from the analog input, the flux pump needs to be subtracted also. This is done by injecting the coarse ADC output and the flux pump from the opposite ends of a large inductor ($L_{int}$) that also performs the integration function. A lowpass filter, which is not shown in the schematic, is provided to reject the out-of-band quantization noise. FIG. 14B shows the scheme corresponding to digital carrier subtraction shown in FIG. 4D. However, the extremely higher inductance ($L_{int}$) required to integrate the full-scale signal results in very low energy coupling to the residue coil ($L_{res}$).

Figure 15:
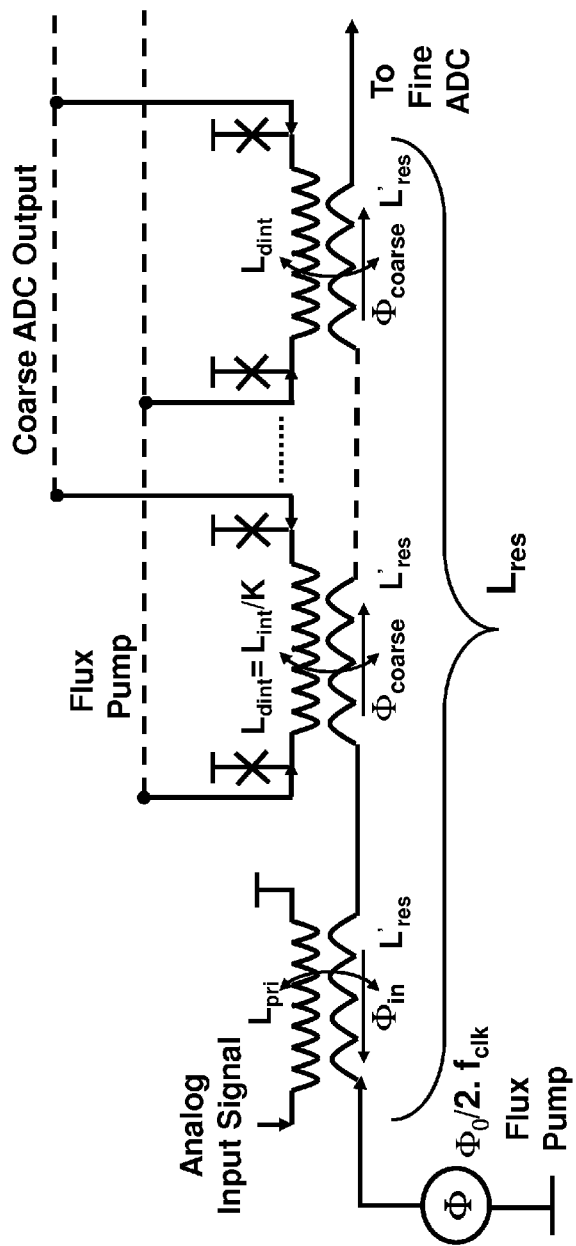
FIG. 15 shows a flux subtractor with a distributed secondary (residue) inductor accommodating multiple fluxon injectors attached to the digital fluxon amplifier.

A preferred approach is to couple a small fraction of the input signal to the coarse ADC and then amplify its output before subtraction with the rest of the analog input. The best way to ensure linearity in amplification is to perform it in the digital domain by producing K copies of the SFQ pulse stream and injecting them into the residue coil. A structure for this amplification is a network of active Josephson transmission line (JTL) splitters. Instead of a single coil carrying the coarse ADC output (and the flux pump), a series of fluxon injector coils are provided, each being driven by a splitter segment, coupling to multiple residue coils in series. This is shown in FIG. 15. This scheme reduces the inductance of each tap to $L_{dint}=L_{int}/K$, thereby improving the energy coupling K-fold. Even for a large amplification factor (K=128), the resulting $L_{dint}$ may still be too large for the desired high energy coupling. The higher $L_{dint}$ also increases the residue inductance ($L_{res}$), and therefore, the noise floor.

A preferred solution is to restrict the residue inductance to obtain a low enough noise floor. To understand the solution, it is instructive to reverse the challenge. First, we fix the total residue inductance to get the desired noise floor, which makes each segment ($L'_{res}=L_{res}/K$). In order to achieve higher energy coupling, the corresponding fluxon injector tap ($L_{tp}$) needs to be significantly reduced. This, in turn, limits the maximum signal that can be integrated to $N \cdot \Phi_0/L_{tp} < I_c$, where $I_c$ is the critical current of the junctions in the injector tap. This restricts N to 2-3, which is much, much less than the desired full-scale signal (~40,000$\Phi_0$/K for $f_{clk}$=40 GHz). Even for a large amplification factor (K=128), we have a difference of two orders of magnitude in the number of flux quanta that each fluxon injector coil can store.

Since we are only interested in the small difference between two large quantities, one approach is to combine the subtraction function with the amplification. A preferred solution provides distributed flux subtraction and amplification. In this scheme, the coarse ADC output is integrated in multiple injector taps, each with a very small inductance. Full-scale signal integration is enabled by restricting the integrated current in each tap to be below critical current ($I_c$). This is accomplished by enabling distributed subtraction by coupling the pick-up coil, carrying the input analog signal, strongly to each of the K taps of the multi-tap coil carrying the amplified coarse ADC output. The input signal continuously subtracts from the signal being integrated in the injector taps, thereby preventing it from exceeding the threshold $I_c$.

Figure 16A:
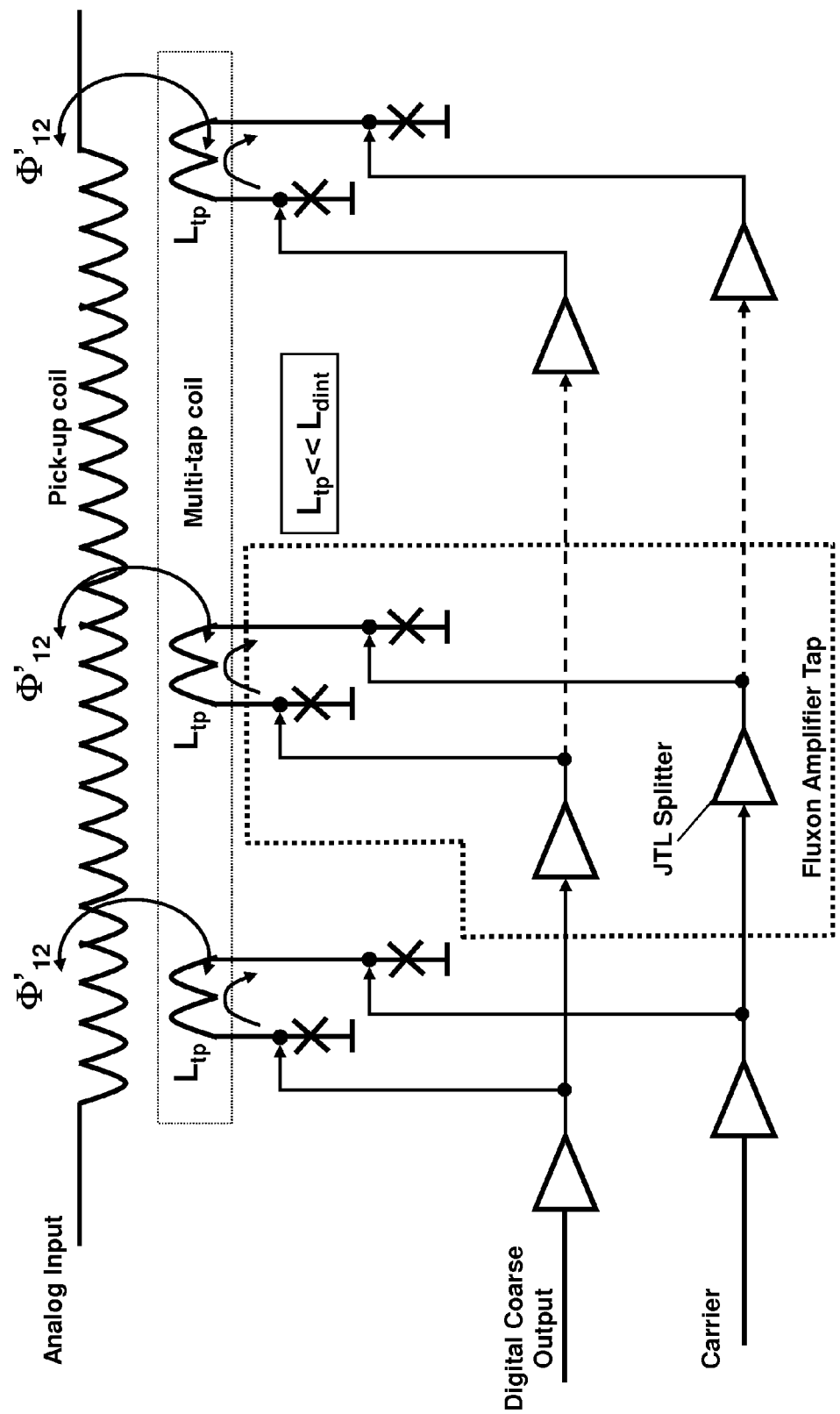
FIG. 16A shows a mixed-signal circuit scheme involving a digital multi-tap fluxon amplifier feeding a set of small fluxon injector taps performing both analog subtraction and integration functions, in which the pick-up coil is considered as a series of smaller coils each coupled to an injector tap coil.
Figure 17:
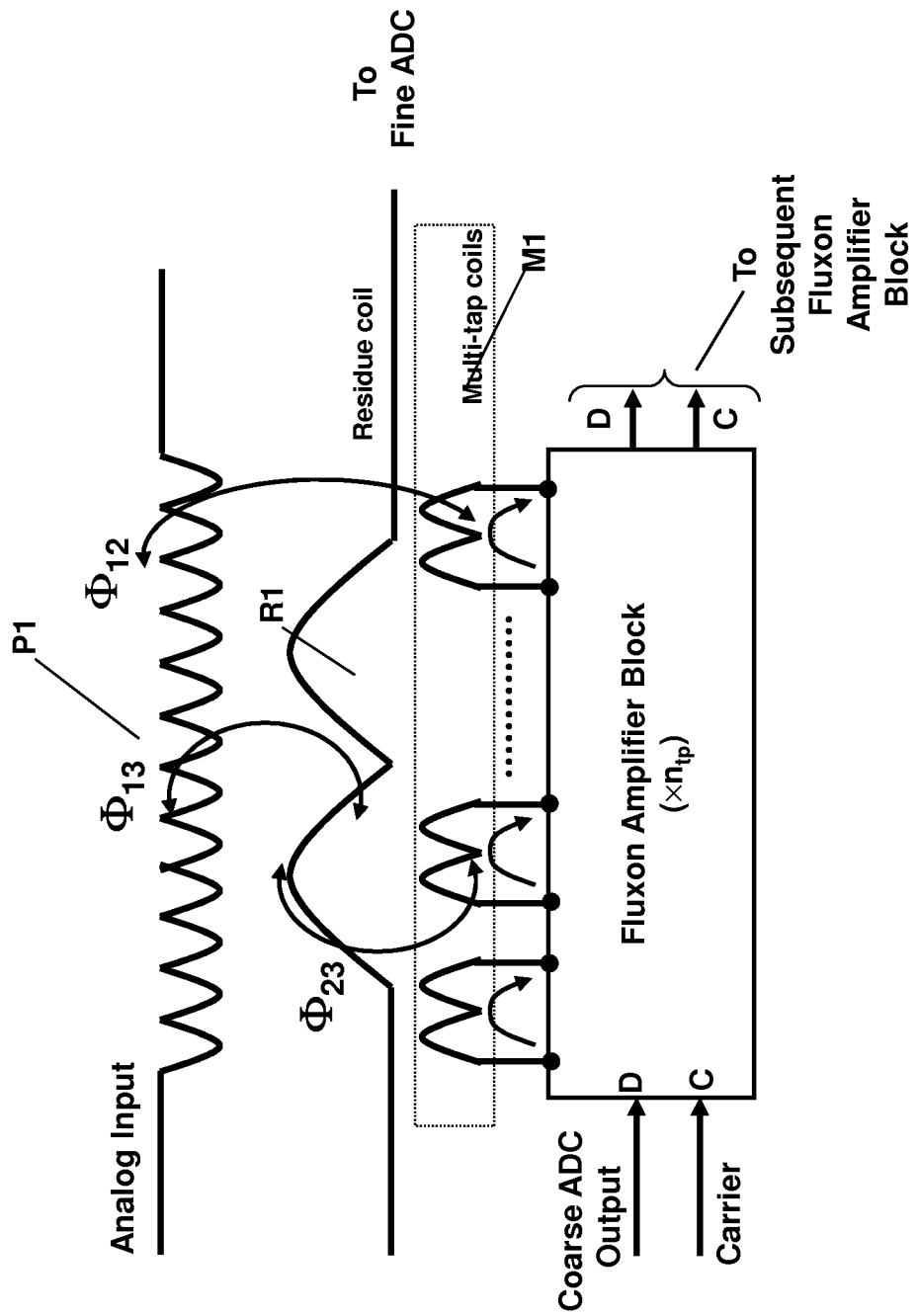
FIG. 17 shows a fluxon amplifier block attached to an $n_{tp}$-tap coil coupled to the pick-up coil and the residue coil.

This distributed subtraction scheme, shown in FIG. 16A is different from an alternative scheme where the integration of the coarse ADC output was done first, and the resultant analog signal then amplified before performing subtraction (Reference 1). In the present scheme shown in FIG. 16A, first the coarse ADC output (and the carrier) is amplified by digital multiplication. Each segment (tap) of this fluxon amplifier comprises a splitter that produces an SFQ pulse propagating to the next segment and another that is injected into the $L_{tp}$ inductor. Next, the integration and the subtraction functions are merged together in a set of injector tap coils. The residue current, which represents the error of the coarse ADC is now integrated in these injector coils and is read out by coupling them with a common residue coil, as shown in FIG. 17. The residue is then digitized by the fine ADC. The fluxon amplifier is divided into several blocks, each feeding a set of $n_{tp}$ injector tap coils. Each fluxon amplifier block has a gain of $n_{tp}$ and has two differential inputs (D and C), representing the coarse ADC's delta modulator output and its carrier respectively. The multi-tap injector is coupled ($\Phi_{12}$) to a pick-up coil (P1). It is also coupled ($\Phi_{23}$) to a residue (R1). There is also direct coupling of flux ($\Phi_{13}$) between the pick-up and the residue coils.

Figure 16B:
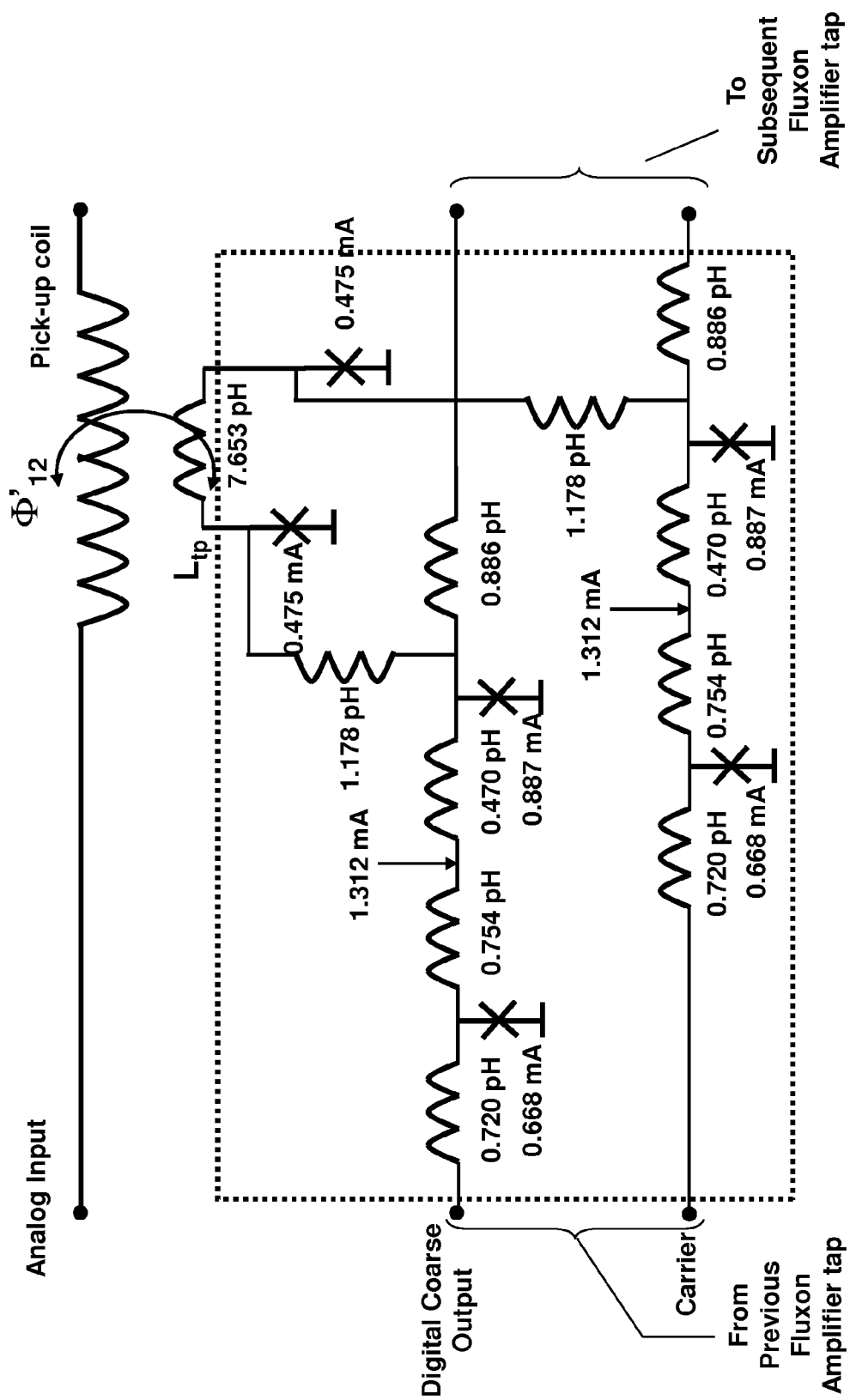
FIG. 16B shows the schematic of a Josephson junction (JJ) circuit for the fluxon amplifier tap of FIG. 16A with representative values of JJ critical current (in mA), inductor values (in pH) and bias currents (in mA).

FIG. 16B shows the circuit schematic of a fluxon amplifier tap. Each digital input stream, representing the coarse ADC's delta modulator output or its carrier, is split into two copies, the first going to the fluxon injector coil and the second propagating on to the corresponding input of the next segment.

Figure 18A:
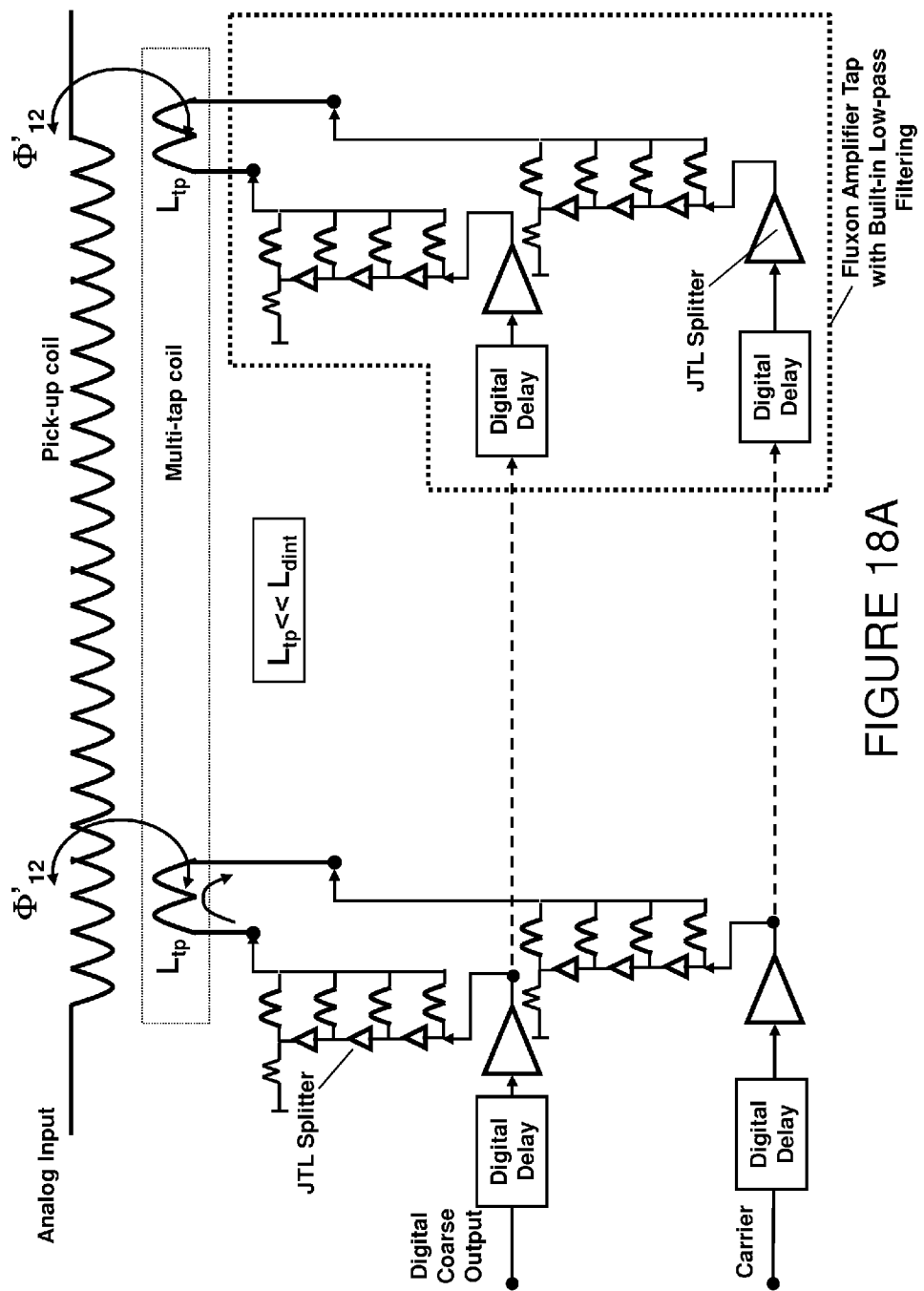
FIG. 18A shows a mixed-signal circuit scheme involving a digital multi-tap fluxon amplifier, with built-in lowpass filtering function, feeding a set of small fluxon injector taps performing both analog subtraction and integration functions. Each fluxon amplifier tap contains digital (clocked) and analog (JTL ladder) delay elements to perform low-pass filtering for both inputs.
Figure 18B:
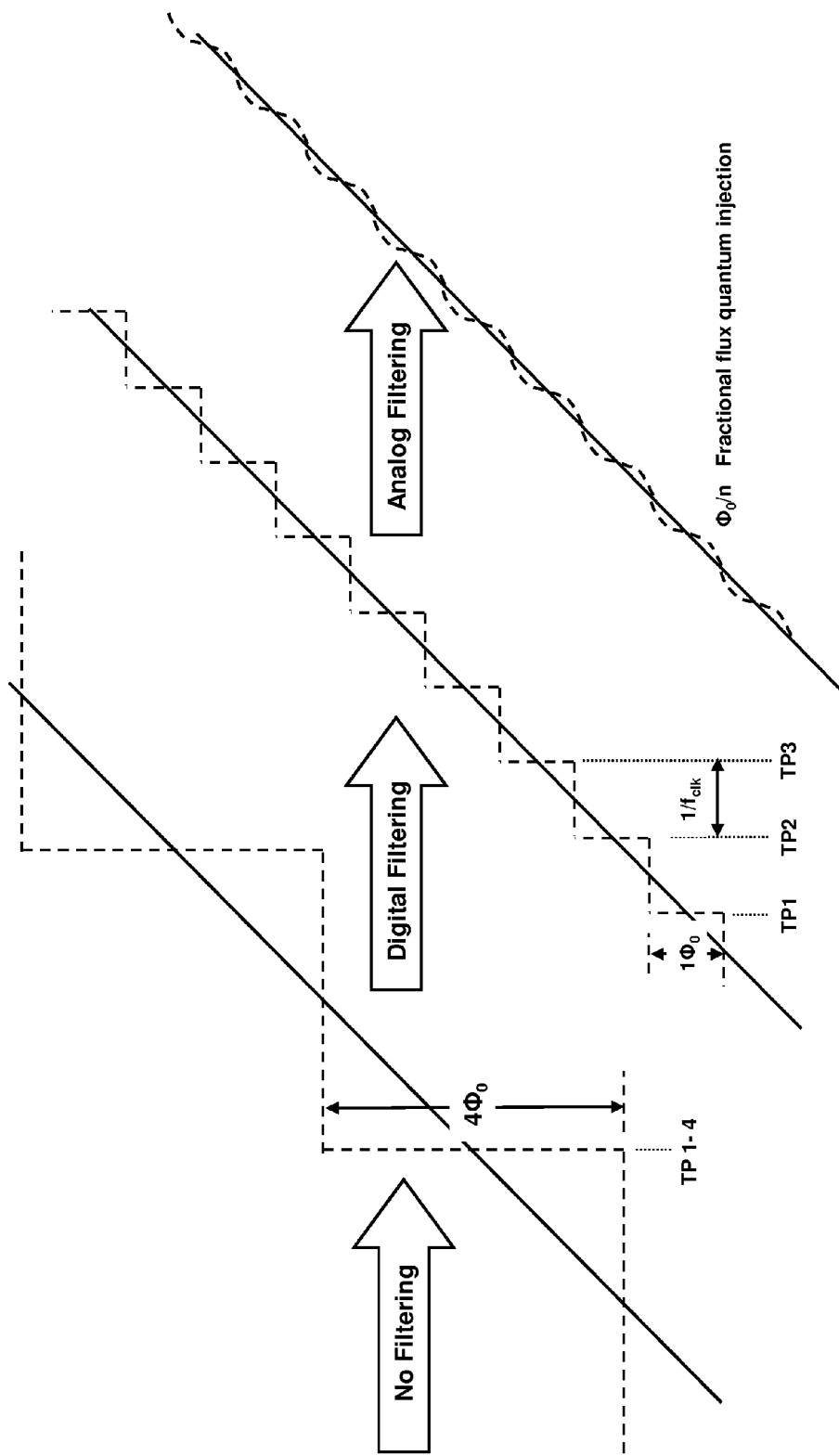
FIG. 18B shows the effect of digital and analog filtering with conceptual flux vs. time diagrams.
Figure 19:
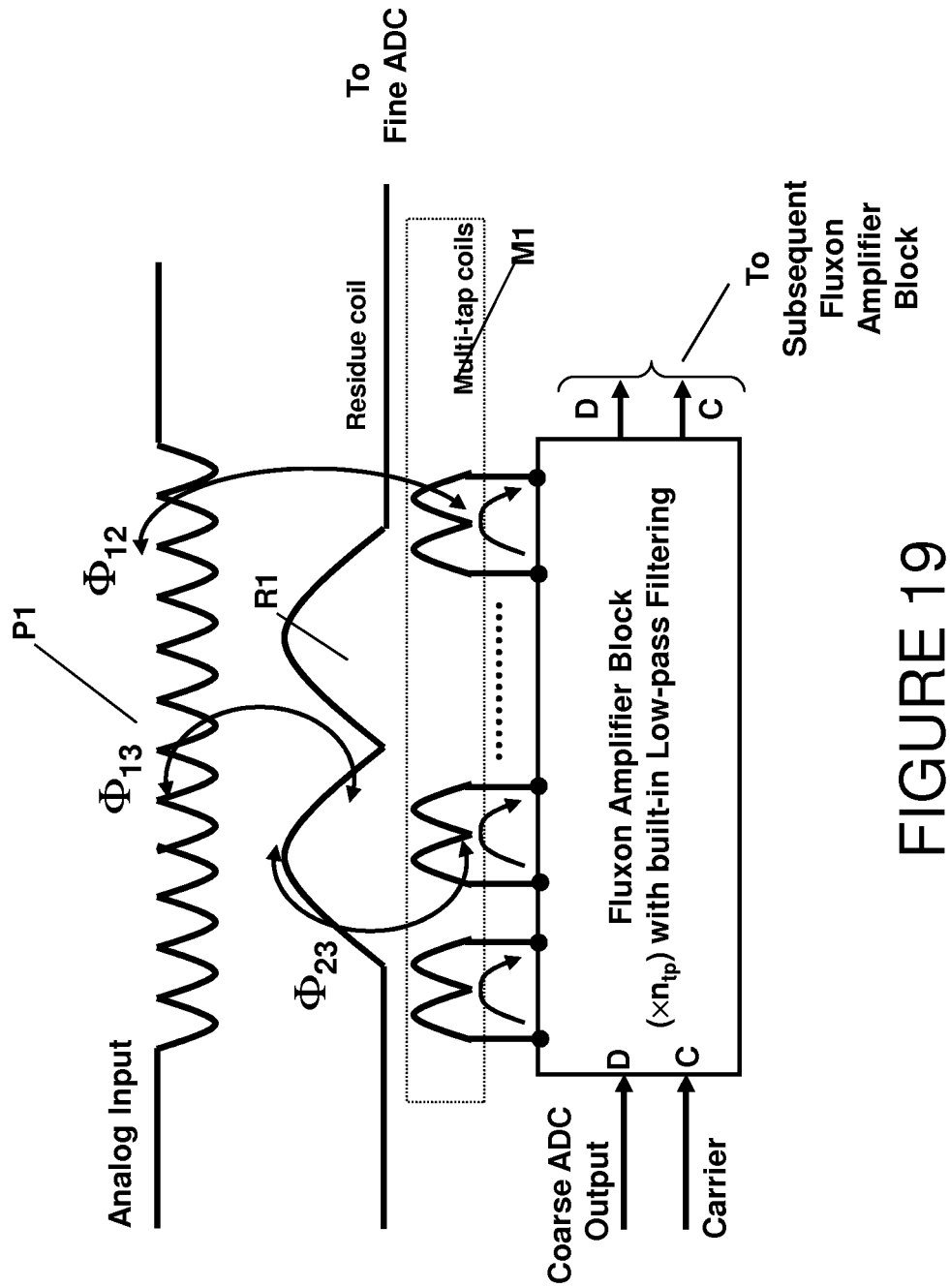
FIG. 19 shows a fluxon amplifier block built-in lowpass filtering function attached to an $n_{tp}$-tap coil coupled to the pick-up coil and the residue coil.

Another function that may be incorporated in this mixed-signal processing circuit block is low-pass filtering. The filtering is done by producing time-delayed copies of a signal and combining them. FIG. 18A shows a scheme for introducing the filtering function within each fluxon amplifier tap. First, a digital delay stage is introduced to delay by one or more clock periods. This acts as a digital filter, as represented in FIG. 18B, reducing the step-size of the staircase function of the injected flux as a function of time. Second, finer analog filtering can be done by introducing a ladder of JTL splitters and adding the split fluxon in parallel inductors. The delay through the JTL may be varied by changing its bias current to obtain the best filtering. FIG. 19 shows a fluxon amplifier block with built-in filtering and a gain equal to the number of taps ($n_{tp}$).

Figure 20:
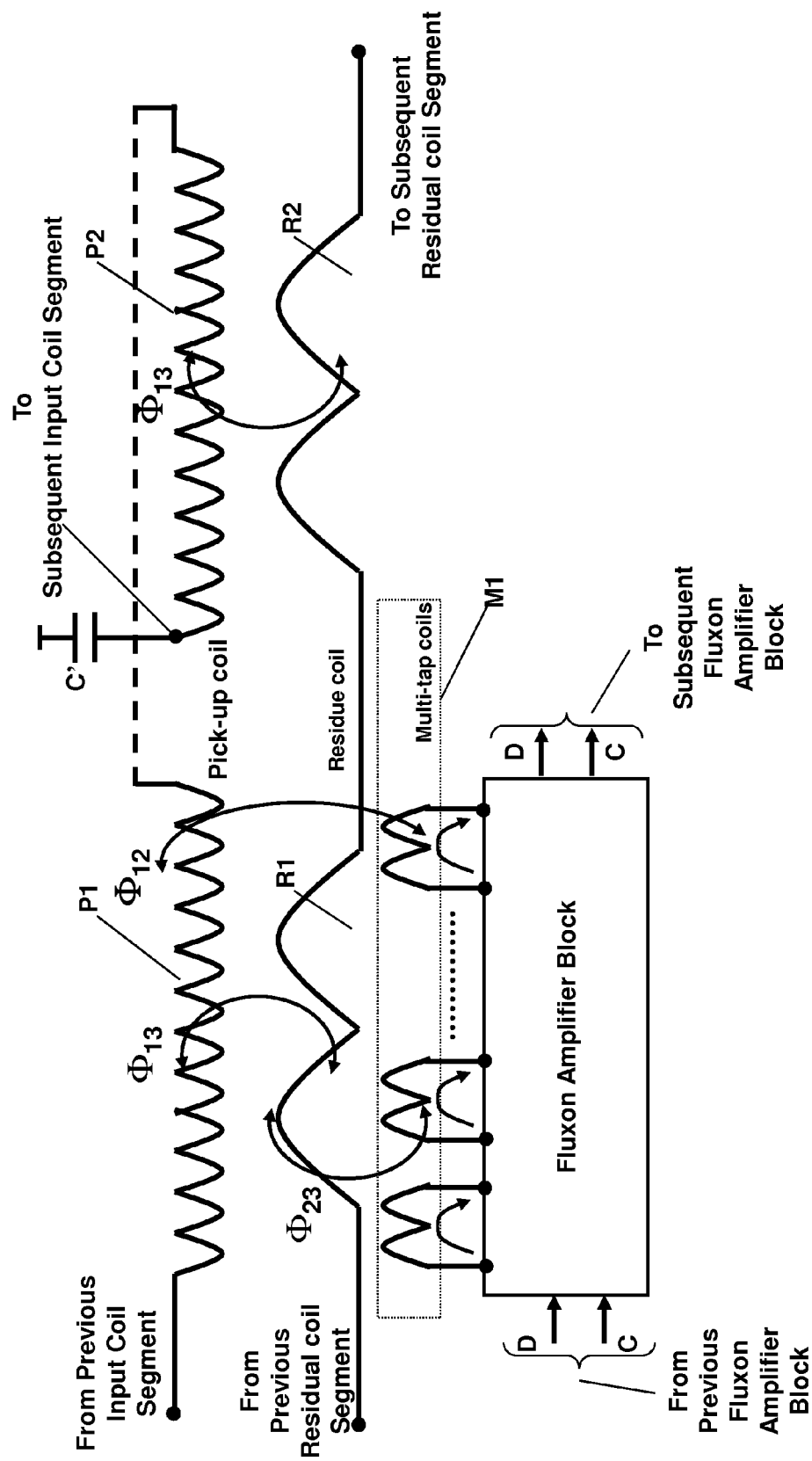
FIG. 20 shows a multi-function mixed-signal block comprising a fluxon amplifier block, a multi-tap fluxon injector coil (M1) coupled to a residue coil (R1) and a pick-up coil (P1), in which unwanted flux coupling ($\Phi_{13}$) between R1 and P1 is cancelled out by another pair of residue coil (R2) and pick-up coil (P2), coupled with opposite sense, and the inductance of the pick-up coil (P1+P2) forms a segment of a transmission line with the capacitor (C').

FIG. 20 shows a multi-function mixed-signal block comprising a fluxon amplifier block attached to a multi-tap fluxon injector coil (M1). The multi-tap injector is coupled ($\Phi_{12}$) to a pick-up coil (P1). It is also coupled ($\Phi_{23}$) to a residue (R1). However, direct coupling ($\Phi_{13}$) between the pick-up and the residue coils is inevitable and undesired. Fortunately, this can be negated by using another set of coils of reversed sense in series. A transmission line structure for the input analog signal to travel between multi-function mixed-signal blocks may be created by using an appropriately valued capacitor (C').

Figure 21:
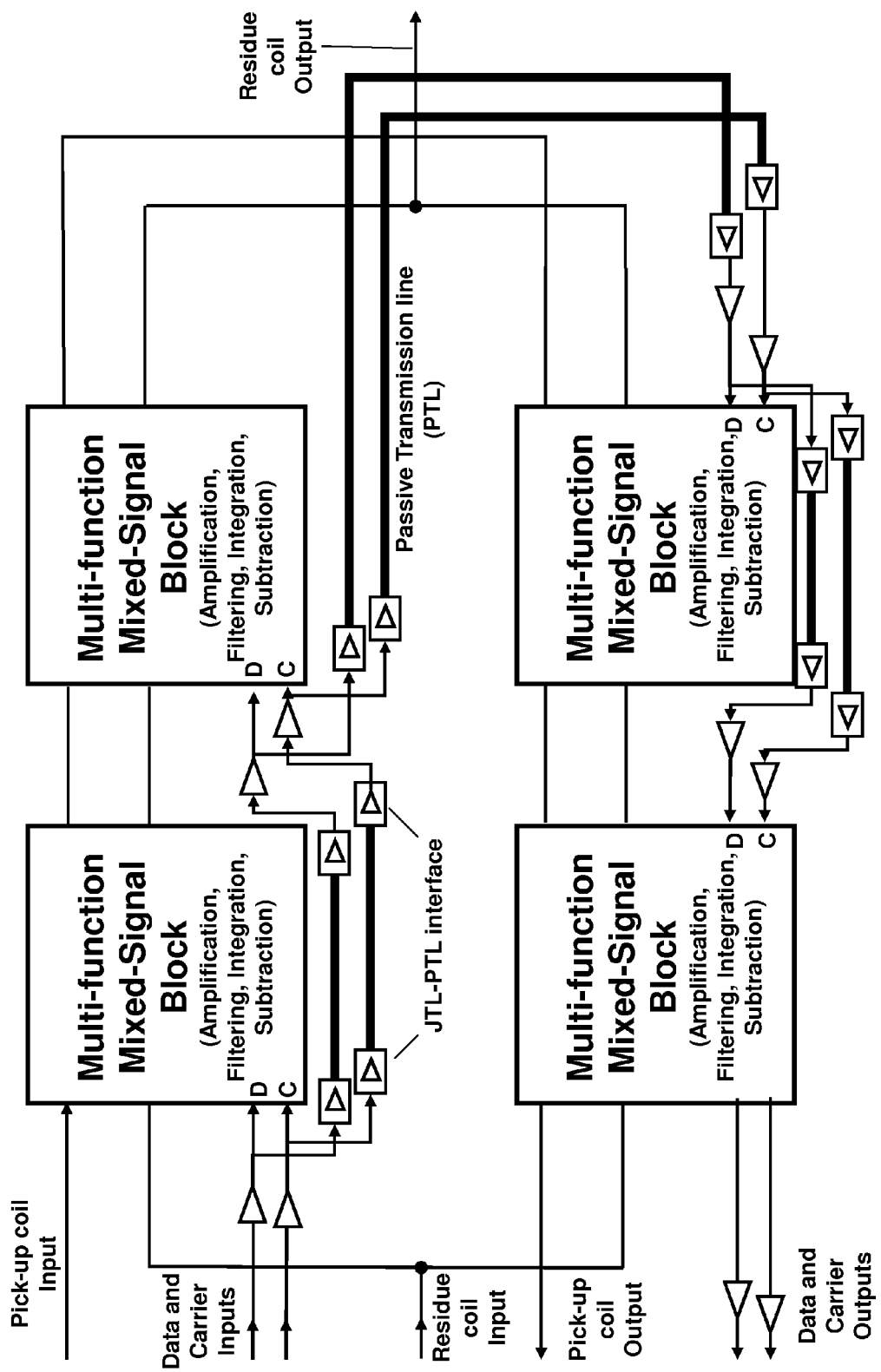
FIG. 21 shows a scheme for doubling the amplification factor without increasing the residue inductance by combining four multi-function mixed-signal blocks.

In order to increase the amplification factor, several of these multi-function mixed-signal blocks are connected in series. However, the series connection proportionally increases the residue inductance and hence the noise floor of the fine ADC. In order to maintain the residue inductance constant, an equal number of blocks need to be connected in parallel. Thus, every doubling of the power amplification necessitates quadrupling the hardware. FIG. 21 depicts a scheme of connecting 4 multi-function mixed-signal blocks to double the gain. The data (D) and the carrier (C) propagation have to match that of the analog input signal. This is accomplished by using a driver-receiver pair to interface SFQ pulses on a passive transmission line (PTL) (Reference 3).

Figure 22:
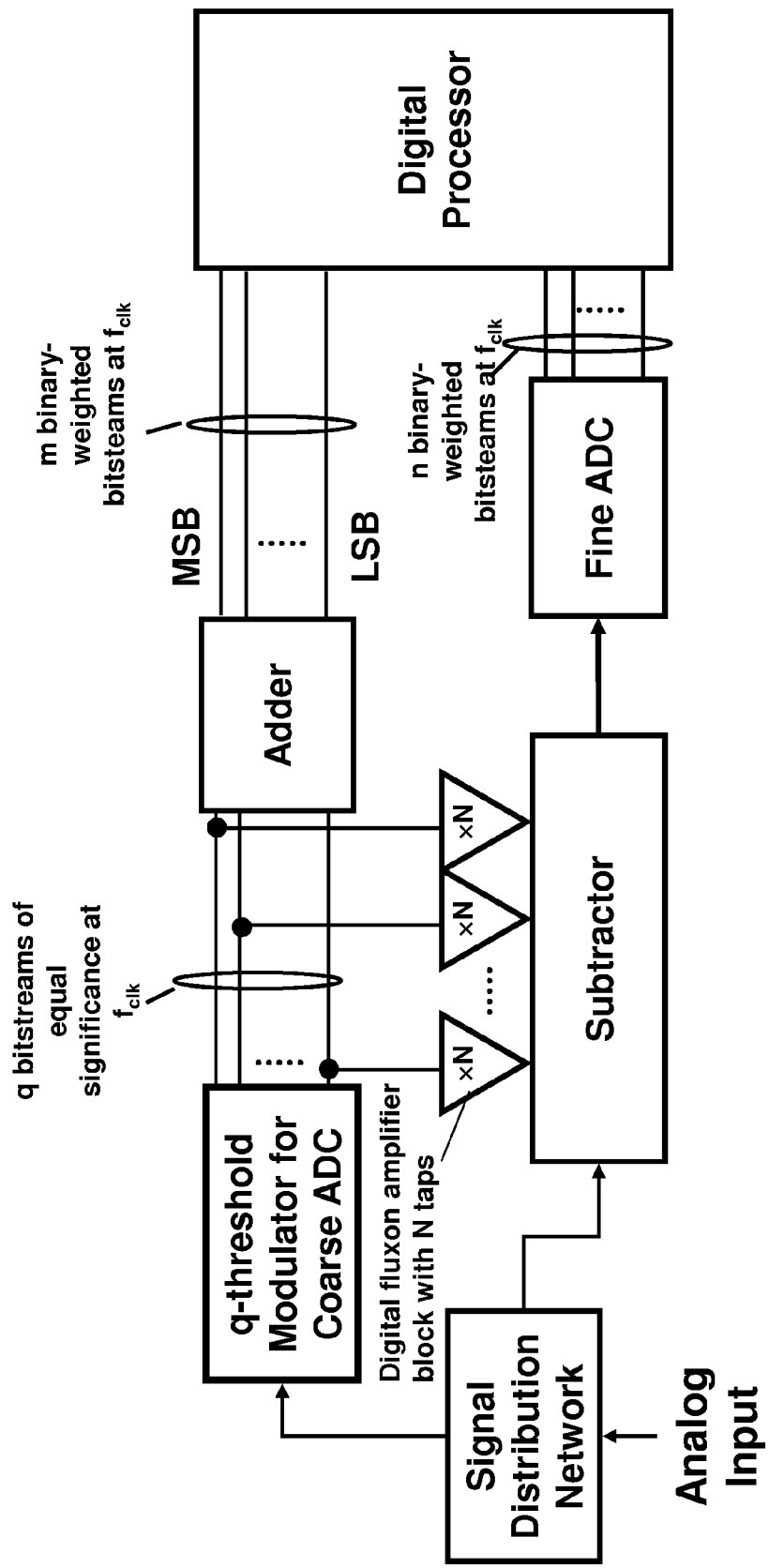
FIG. 22 shows a subranging scheme with a coarse ADC comprising a multi-threshold modulator producing a q-bit code, where each bit is of equal significance; a corresponding inter-range mixed-signal interface comprising q N-tap fluxon amplifier blocks and a subtractor; an n-bit fine ADC; and a digital processor for appropriately combining it with the m-bit coarse ADC output.
Figure 23:
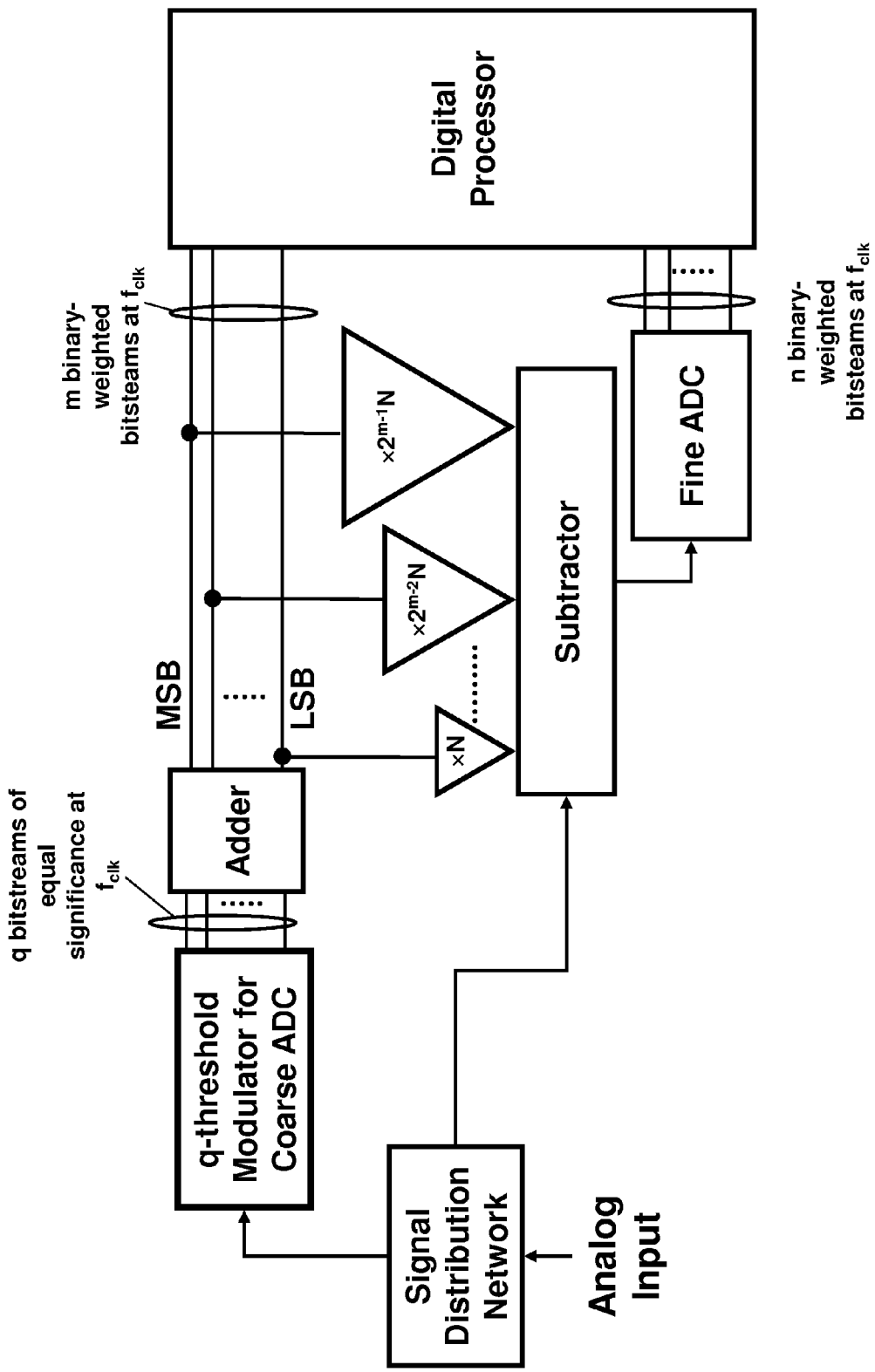
FIG. 23 shows a subranging scheme with a coarse ADC comprising a multi-threshold modulator producing an m-bit binary code, a corresponding inter-range mixed-signal interface comprising a set of fluxon amplifier blocks with binary amplification factors and a subtractor, an n-bit fine ADC, and a digital processor for appropriately combining it with the m-bit coarse ADC output.
Figure 24:
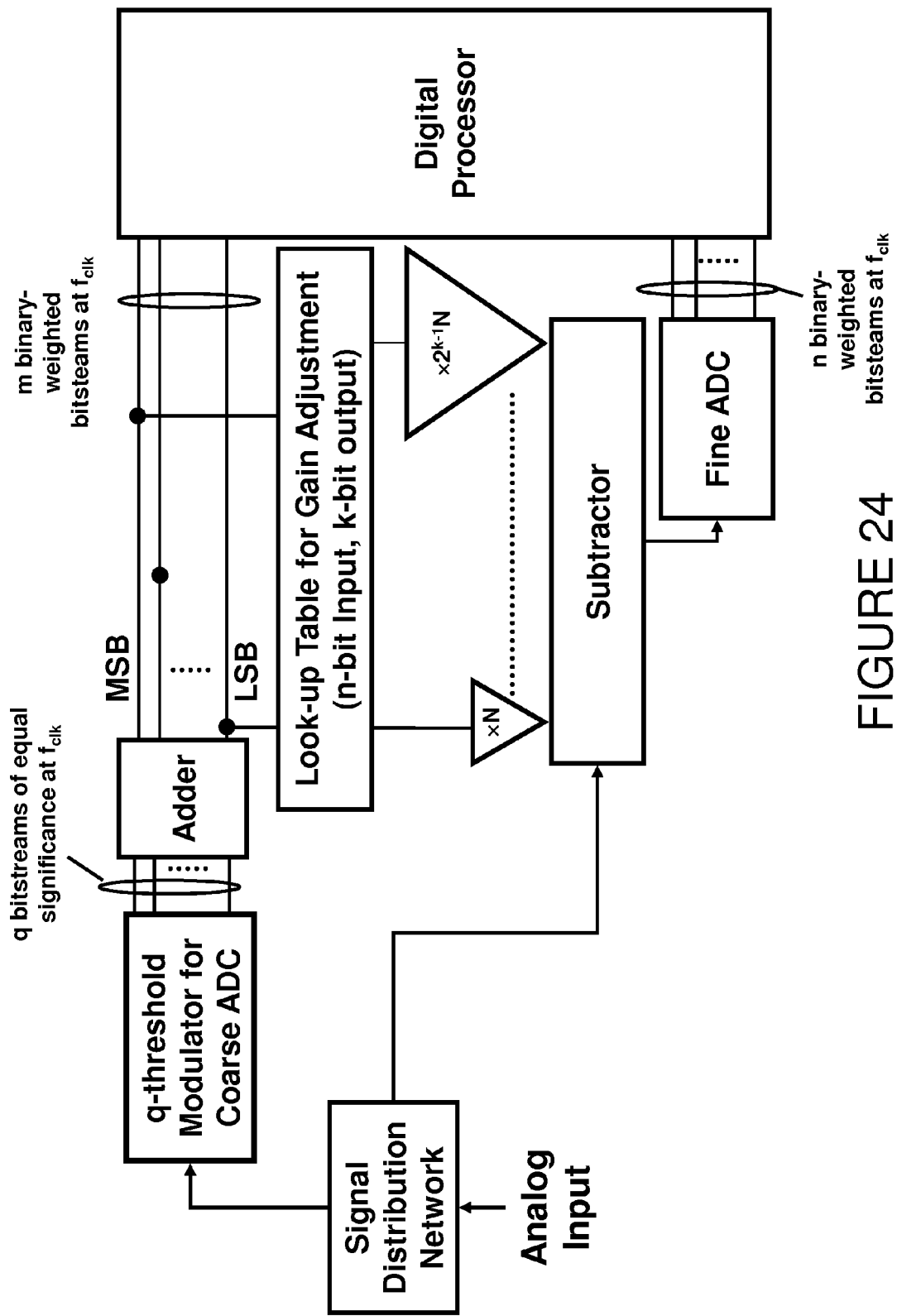
FIG. 24 shows a subranging scheme with a coarse ADC comprising a multi-threshold modulator producing an m-bit binary code, a corresponding inter-range mixed-signal interface comprising a digital m-bit-in, k-bit-out look-up-table for gain adjustment, a set of fluxon amplifier blocks with binary amplification factors, and a subtractor, an n-bit fine ADC, and a digital processor for appropriately combining it with the m-bit coarse ADC output.

Multi-threshold delta and sigma-delta modulators produce higher intrinsic dynamic range. FIG. 22 shows a subranging scheme for using such a multi-threshold modulator in the coarse ADC. For example, the PMD ADC with multi-channel synchronizer produces thermometer-coded multi-bit output, which is subsequently added to produce an m-bit binary weighted signal for interfacing with a digital processor, such as a cascaded-integrator-comb (CIC) digital decimation filter (Reference 2). The inter-range mixed-signal processor for such a multi-threshold coarse ADC modulator may be constructed with the same basic building blocks described for the subranging ADC with single threshold modulator (FIG. 4A). In the scheme shown in FIG. 22, there are q bitstreams of equal significance which are amplified by a factor of N each with the digital fluxon amplifier blocks, with or without built-in low-pass filtering. These blocks are combined with a subtractor comprising a multi-tap flux injector coil also performing the function of integration. Digital-to-analog conversion takes place in the boundary between the fluxon amplifiers and the fluxon injector coils. It is also possible to take the binary-weighted m-bit output after the adder in the coarse ADC (FIG. 23). In this case, the bits must be amplified according to their significance. If the least significant bit is amplified N times, the most significant bit must be amplified by a factor of $2^{m-1}N$. The binary-weighted numbers offer more compact digital logic implementations which are advantageous for extending the inter-range digital processing. For example, further adjustments of gain may be necessary to compensate for gain mismatches between the coarse and fine ADC analog inputs and for non-ideal transformer coupling. A programmable digital look-up table placed within the inter-range processor, as shown in FIG. 24, provides a method to adjust gain.

Figure 25:
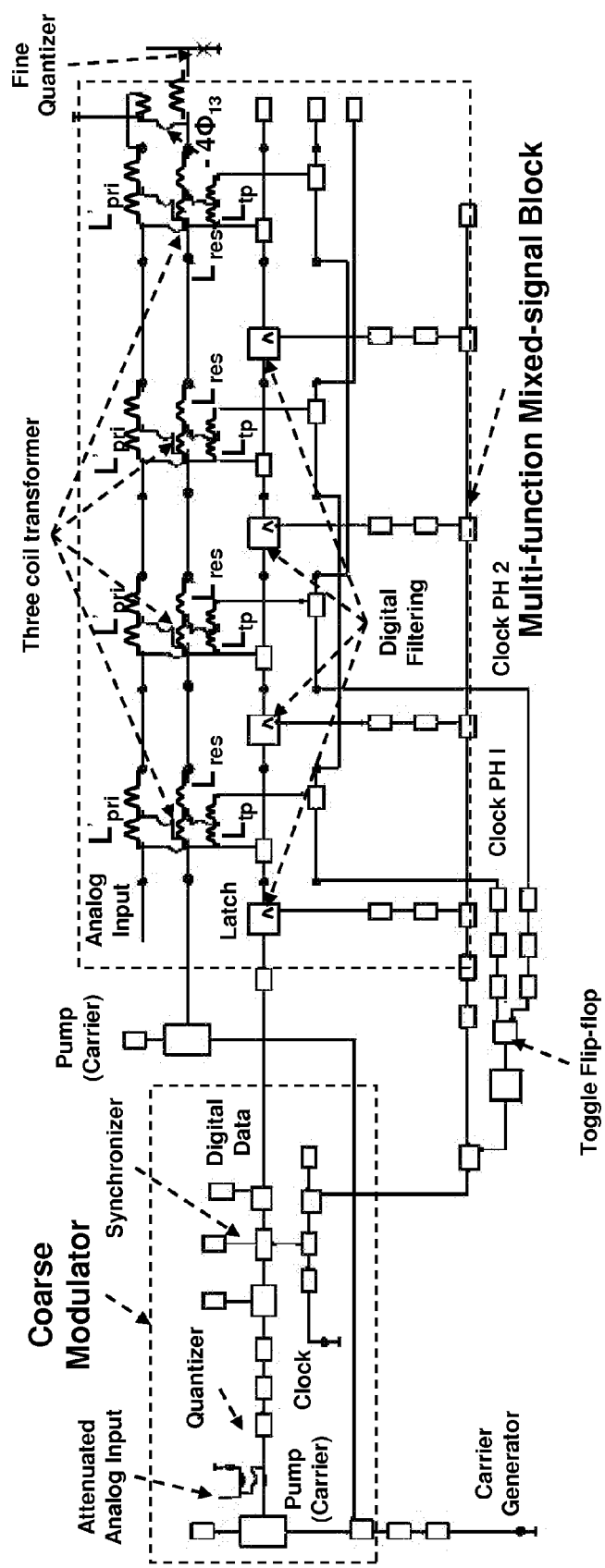
FIG. 25 shows the block level schematic used to simulate the delta-delta subranging ADC with a 4-tap inter-range mixed signal processor, in which two similar flux quantizers are used in the PMD coarse and fine modulators.

FIG. 25 shows the block level schematic used to simulate the delta-delta subranging ADC. Two similar flux quantizers are used in the PMD coarse and fine modulators. A fraction (1/K) of the full-scale input signal ((1+K)/K) is applied to the coarse ADC, while the rest is applied to the fine ADC. The intrinsic slew rate limit of this flux-quantizing ADC is a single flux quantum ($\Phi_0$) in each sampling interval. Therefore, the most natural configuration for the flux pump is to inject fluxons at $\Phi_0/2$ per sampling period, to accommodate bipolar input signals $\pm\Phi_0/2$ per sampling period. This is done by pumping fluxons at a frequency of $f_{pump}=f_{clk}/2$. Thus, in the absence of the input signal, both the quantizers pulse at the pump frequency. When an additional input signal is coupled to the quantizer loop, the pulse positions either advance or retard in proportion to the derivative of the input signal, thus producing a phase modulated pulse stream at the quantizer output. This phase modulated pulse stream is demodulated by the synchronizer, which is a clocked sampling circuit generating a '1' or '0' indicating whether or not a pulse arrived in a given clock period. This 1-bit oversampled differential code from the synchronizer is then digitally integrated, filtered, and amplified by K to generate the m most significant bits of the subranging ADC. This digital processing of the coarse modulator output to generate m bits appropriate significance is not shown in the schematic.

To generate the additional n bits, the coarse modulator output is further processed by the inter-range mixed signal processor. The digital data from the coarse ADC is amplified by digitally multiplying the SFQ pulses and integrating each pulse in different taps ($L_{tp}$) of the multi-tap coil. A 4-tap inter-range processor is used for simulation. The unipolar to bipolar conversion of the coarse modulator is achieved by digitally subtracting the carrier by injecting it from the opposite end of each tap. The coarse modulator output needs to be lowpass filtered to reject the out of band quantization noise. The filtering functionality is merged in the amplification process by digitally delaying the inputs to the multiple taps, thus reducing the step size of the integrated signal to generate a more smoothly changing signal (FIGS. 18A, 18B). Similarly, to filter the carrier, two 180 degrees phase shifted carriers (PH1 and PH2) are generated from the master clock; PH1 being used to subtract carrier from odd numbered taps and PH2 being used to subtract carrier from the even numbered taps.

To integrate the full-scale signal, $L_{tp}$ needs to be large enough to integrate a few hundred fluxons (~300 for 10 MHz input signal, sampled at 40 GHz). However, to reduce the noise floor the residue inductance should be very small, and to increase the energy coupling between each tap and the residue coil, the tap inductance needs be extremely small. Hence, the saturation current of $L_{tp}$ is chosen so as to integrate a maximum of two fluxons per tap. On exceeding the saturation current, the fluxon is not integrated but released by unintended switching of the carrier port junction. To enable full-scale signal integration while using a very small tap inductance, the integration and subtraction functions are merged, so as to restrict the residual current per tap to be lower than the saturation limit of $L_{tp}$. This is accomplished by enabling distributed subtraction by coupling the input coil strongly to each of the taps of the multi-tap coil. The input signal continuously subtracts the signal being integrated in each tap, thereby preventing it from reaching the saturation limit of the tap inductor. An inevitable and undesired consequence of this scheme is a direct coupling ($\Phi_{13}$) between the input and the residue coils. Fortunately, this can be negated by using another coil or reversed polarity in series ($-4\Phi_{13}$ in FIG. 25). The residual current in each tap represents the error of the coarse ADC and is integrated by coupling each tap with a common residue coil. The integrated residue is then digitized by the fine modulator (only the fine quantizer is shown in the schematic). In FIG. 25, all blocks not otherwise labeled are active Josephson transmission line segments for either digital signal propagation or splitting.

Figure 26:
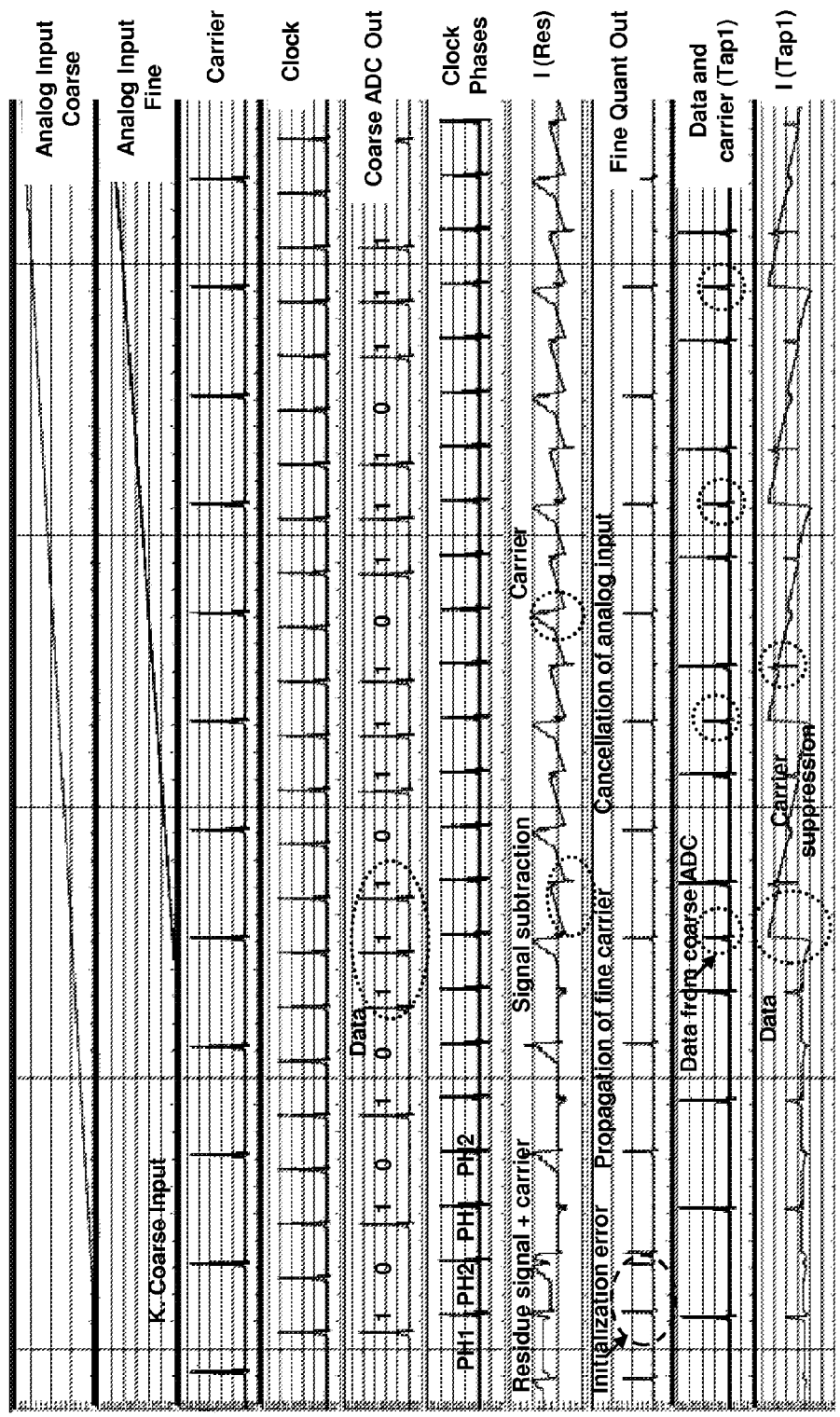
FIG. 26 shows the simulation result of the delta-delta subranging ADC of FIG. 25 with a 4-tap inter-range mixed signal processor.

FIG. 26 shows the circuit-level simulation result of the delta-delta subranging ADC with a 4-tap inter-range mixed signal processor. The same analog input is applied to the coarse and fine ADC. However, the coupling coefficient of the coarse ADC input transformer is K times smaller, resulting in a factor of K smaller input signal being coupled to the coarse ADC. The carrier represents a copy of SFQ pulses being applied to the pump which is then smoothed out by the pump to generate a slowly changing current. The carrier signal is applied at half the clock frequency. In the absence of input signal, the coarse ADC output (synchronizer) generates a '1010' pattern which is then modulated by the input signal. For example, the three consecutive '1's' in the coarse ADC output pattern is a consequence of modulation of the carrier by the input signal. The clock phases represent the two phase shifted carriers being used for unipolar to bipolar conversion of the coarse ADC output. I(Res) represents the current in the residue inductor, which is the sum of the current due to the carrier and the integrated residual current from the multiple tap inductors. For low clock frequency simulations, two distinct changes in residual current can be identified; one corresponds to injection of carrier, and the other corresponds to signal subtraction in the tap inductors. The fine quantizer output shows the propagation of the carrier, representing significant cancellation of the analog input to the fine ADC such that the residual error being generated is smaller than the flux resolution of the fine quantizer. Other simulations have verified the phase modulation of the fine carrier by the residual current. The penultimate trace shows the data and carrier pulses being injected in tap1. The pulses encircled with dashed lines represent the excess pulses in coarse ADC output because of the input signal; whereas the other pulses correspond to the carrier of the coarse ADC. The fluxons being applied to the carrier port of the inter-range interface overlap with the carrier pulses in the coarse ADC output, and are indistinguishable in the figure. Finally, the last trace represents the current being integrated in the first tap. Here again, two distinguishable processes can be identified: one corresponds to the increase in current corresponding to fluxon injection from coarse ADC in response to input signal and the subsequent subtraction because of the coupling to the fine analog input signal, and the second process corresponds to carrier subtraction of the coarse ADC in the inter-range interface that results in spikes in the tap current.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

REFERENCES

Each of which is Expressly Incorporated Herein by Reference

1. A. Inamdar, S. Rylov, A. Talalaevskii, A. Sahu, S. Sarwana, D. E. Kirichenko, I. V. Vernik, T. V. Filippov, and D. Gupta, "Progress in Design of Improved High Dynamic Range Analog-to-Digital Converters," *IEEE Trans. Appl. Supercond.*, vol. 19, no. 2, pp. 670-675, June 2009.
2. T. V. Filippov, S. V. Pflyuk, V. K. Semenov, and E. B. Wikborg, "Encoders and decimation filters for superconductor oversampling ADCs," *IEEE Transactions on Applied Superconductivity*, vol. 11, pp. 545-549, March 2001.
3. Hideo Suzuki, Shuichi Nagasawa, Kazunori Miyahara, and Youich Enomoto, "Characteristics of Driver and Receiver Circuits with a Passive Transmission Line in RSFQ Circuits," *IEEE Transactions on Applied Superconductivity*, vol. 10, no. 3, pp. 1637-1641, September 2000.
4. O. A. Mukhanov, D. Gupta, A. M. Kadin, and V. K. Semenov, "Superconductor Analog-to-Digital Converters," *Proceedings of the IEEE*, vol. 92, no. 10., pp. 1564-1584, October 2004.
5. S. V. Rylov and R. P. Robertazzi, "Superconductive high-resolution A/D converter with phase modulation and multichannel timing arbitration," *IEEE Trans. Appl. Supercond.*, vol. 5, pp. 2260-2263, 1995.
6. O. A. Mukhanov, V. K. Semenov, D. K. Brock, A. F. Kirichenko, W. Li, S. V. Rylov, J. M. Vogt, T. V. Filippov, and Y. A. Polyakov, "Progress in the development of a superconductive high-resolution ADC," in Extended Abstracts ISEC'99, Berkeley, Calif., pp. 13-16.
7. D. Gupta, T. V. Filippov, A. F. Kirichenko, D. E. Kirichenko, I. V. Vernik, A. Sahu, S. Sarwana, P. Shevchenko, A. Talalaevskii, and O. A. Mukhanov, "Digital Channelizing Radio Frequency Receiver," IEEE Trans. Appl. Supercond., vol. 17, no. 2, pp. 430-437, June 2007.
8. Igor V. Vernik, Dmitri E Kirichenko, Vladimir V. Dotsenko, Robert Miller, Robert J. Webber, Pavel Shevchenko, Andrei Talalaevskii, Deepnarayan Gupta and Oleg A Mukhanov, "Cryocooled wideband digital channelizing radio-frequency receiver based on low-pass ADC," *Supercond. Sci. Technol.*, vol. 20, pp. S323-327, 2007.
9. A. Inamdar, S. Rylov, A. Sahu, S. Sarwana, and D. Gupta, "Quarter-Rate Superconducting Modulator for Improved High Resolution Analog-to-Digital Converter," *IEEE Transactions on Applied Superconductivity*, vol. 17, pp. 446-450, June 2007.

What is claimed is:

1. A signal processing system, comprising:
an input configured to receive an analog signal;
a first electronic circuit configured to selectively produce a stream of quantized pulses which represent an amplitude of the received analog signal delayed with respect to the analog signal;
a time delay structure configured to control a time delay of the received analog signal with respect to the stream of quantized pulses, and producing a delayed received analog signal;
a second electronic circuit configured to selectively produce an analog residue signal representing a difference between an amplitude of the delayed received analog signal and the represented amplitude of the received analog signal;
a third electronic circuit configured to selectively produce a quantized representation of the analog residue signal; and
a digital signal processor, configured to receive the stream of quantized pulses and the quantized representation of the analog residue signal, and to generate a signal representing the amplitude of the received analog signal with an accuracy greater than the stream of quantized pulses.

2. The signal processing system of claim 1, wherein at least one of the stream of quantized pulses and the quantized representation of the analog residue signal are quantized in units of magnetic flux.

3. The signal processing system of claim 2, wherein the first electronic circuit comprises a delta modulator, and the third electronic circuit comprises a sigma-delta modulator.

4. The signal processing system of claim 1, wherein at least one of the first electronic circuit and the third electronic circuit comprises a phase-modulation-demodulation modulator.

5. The signal processing system of claim 1, wherein the second electronic circuit comprises at least two magnetically coupled conductive elements.

6. The signal processing system of claim 1, further comprising an amplifier to amplify the stream of quantized pulses, and at least one integration element configured to smooth the amplified stream of quantized pulses, before passing the smoothed amplified stream of quantized pulses to the second electronic circuit.

7. The signal processing system of claim 6, wherein the amplifier comprises at least one Josephson junction, and the amplified stream of quantized pulses has a plurality of pulses corresponding to each pulse of the stream of quantized pulses.

8. The signal processing system of claim 1, wherein the signal representing the amplitude of the received analog signal with an accuracy greater than the stream of quantized pulses comprises a phase-modulated digital signal.

9. The signal processing system of claim 1, further comprising an amplifier to amplify the stream of quantized pulses, wherein the amplified stream of quantized pulses comprises at least two parallel streams of digital pulses representing signal components of unequal logical weight.

10. The signal processing system of claim 1, further comprising a digital filter having at least one information storage element, configured to receive the stream of quantized pulses over time and to selectively produce a digitally filtered output dependent on the stream of quantized pulses and time.

11. The signal processing system of claim 10, wherein the digital filter comprises a decimator that reduces an output sampling rate.

12. The signal processing system of claim 1, wherein the time delay structure comprises a digitally adjustable time delay structure.

13. The signal processing system of claim 1, wherein the first electronic circuit has at least two quantization thresholds.

14. A method of signal processing, comprising:
receiving an analog signal;
selectively producing a stream of quantized pulses which represent an amplitude of the received analog signal delayed with respect to the analog signal with a first electronic circuit;
controlling a time delay of the received analog signal with respect to the stream of quantized pulses, and producing a delayed received analog signal;
selectively producing an analog residue signal representing a difference between an amplitude of the delayed received analog signal and the represented amplitude of the received analog signal with a second electronic circuit;
selectively producing a quantized representation of the analog residue signal with a third electronic circuit; and
receiving the stream of quantized pulses and the quantized representation of the analog residue signal with a digital signal processor, and generating a signal representing the amplitude of the received analog signal with an accuracy greater than the stream of quantized pulses.

15. The method of claim 14, further comprising amplifying the stream of quantized pulses, integrating the amplified stream of quantized pulses, and feeding the integrated amplified stream of quantized pulses to a magnetic flux subtractor.

16. The method of claim 15, wherein the amplified stream of quantized pulses comprises a plurality of pulses corresponding to each pulse of the stream of quantized pulses.

17. The method of claim 14, wherein the stream of quantized pulses has an associated clock having a clock frequency in excess of 40 GHz.

18. The method of claim 14, wherein the digital signal processor generates the digital in dependence on at least a past history of at least one quantized signal.

19. The method of claim 14, wherein the time delay is digitally controlled.

20. A method of signal processing, comprising:
 receiving an analog signal;
 selectively producing a stream of quantized pulses which represent a waveform of the received analog signal controllably delayed in time with respect to the analog signal;
 controlling a time delay of the received analog signal with respect to the stream of quantized pulses, and producing a delayed received analog signal;
 selectively producing an analog residue signal representing a quantitative difference between a waveform of the delayed received analog signal and the represented waveform of the received analog signal;
 selectively producing a quantized representation of the analog residue signal; and
 receiving the stream of quantized pulses and the quantized representation of the analog residue signal with a digital signal processor, and generating a signal representing the waveform of the received analog signal with an accuracy greater than the stream of quantized pulses.

* * * * *